US012763122B2

(12) United States Patent
Islam et al.

(10) Patent No.: US 12,763,122 B2
(45) Date of Patent: Oct. 13, 2026

(54) READ/WRITE CIRCUITS FOR MULTI-STORY CROSS-POINT MEMORY

(71) Applicant: Sandisk Technologies, Inc., Milpitas, CA (US)

(72) Inventors: Ashraf B. Islam, El Dorado Hills, CA (US); Jaydip Patel, Folsom, CA (US); Nicolas Irizarry, Folsom, CA (US); William Sheung, Folsom, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 169 days.

(21) Appl. No.: 18/679,474

(22) Filed: May 31, 2024

(65) Prior Publication Data

US 2025/0372138 A1 Dec. 4, 2025

(51) Int. Cl.
*G11C 7/22* (2006.01)
*G11C 11/16* (2006.01)

(52) U.S. Cl.
CPC ...... *G11C 11/1673* (2013.01); *G11C 11/1655* (2013.01); *G11C 11/1657* (2013.01)

(58) Field of Classification Search
CPC ............ G11C 11/1673; G11C 11/1655; G11C 11/1657
USPC .................................................. 365/189.011
See application file for complete search history.

(56) References Cited

U.S. PATENT DOCUMENTS

| | | | | |
|---|---|---|---|---|
| 7,330,367 | B2 | 2/2008 | Nejad et al. | |
| 7,577,016 | B2 | 8/2009 | Jeong et al. | |
| 8,144,506 | B2 * | 3/2012 | Wells | G11C 11/1675 365/189.04 |
| 8,848,426 | B2 | 9/2014 | Azuma et al. | |
| 10,553,647 | B2 | 2/2020 | Grobis et al. | |
| 10,937,497 | B2 | 3/2021 | Bertin et al. | |
| 11,114,143 | B2 | 9/2021 | Srinivasan et al. | |
| 11,222,259 | B2 | 1/2022 | Koswatta et al. | |
| 11,430,515 | B2 | 8/2022 | Lee et al. | |
| 11,501,831 | B2 * | 11/2022 | Robertson | G11C 13/0069 |
| 11,735,235 | B2 | 8/2023 | Dong et al. | |
| 2021/0241828 | A1 | 8/2021 | Banerjee et al. | |
| 2022/0139454 | A1 | 5/2022 | Robertson et al. | |

* cited by examiner

*Primary Examiner* — Tha-O H Bui
(74) *Attorney, Agent, or Firm* — Pearl Cohen LLP

(57) ABSTRACT

An apparatus includes one or more control circuits to connect to a multi-story memory structure. The multi-story memory structure includes nonvolatile memory cells each having a programmable resistive element. The control circuits are configured to receive addresses of selected cells and for each selected cell determine a story in which the selected cell is located from stories including a first story between a first word line layer and a bit line layer and a second story between the bit line layer and a second word line layer. The control circuits are further configured to connect a sense amplifier to a first selected nonvolatile memory cell in the first story through a bit line of the bit line layer and connect the sense amplifier to a second selected nonvolatile memory cell in the second story through a second word line of the second word line layer.

18 Claims, 22 Drawing Sheets

Story0 read

Story1 read

READ/WRITE CIRCUITS FOR MULTI-STORY CROSS-POINT MEMORY

BACKGROUND

Memory is widely used in various electronic devices such as cellular telephones, digital cameras, personal digital assistants, medical electronics, mobile computing devices, non-mobile computing devices, and data servers. Memory may comprise nonvolatile memory or volatile memory. A non-volatile memory allows information to be stored and retained even when the nonvolatile memory is not connected to a source of power (e.g., a battery).

One example of a nonvolatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Some nonvolatile memory arrays are arranged in a cross-point arrangement with word lines extending perpendicularly to bit lines and with memory cells formed where they cross. Some cross-point memory arrays have two or more stories or levels of memory cells.

Read/write circuits may be used to read data from and write data to nonvolatile memory cells. Data may be read by sensing current or voltage at sense nodes while current flows through selected memory cells. Sense amplifiers may be provided to performing sensing. Sense amplifiers and/or other read/write circuits may occupy a significant area on a memory die. Efficient design may reduce the area occupied by sense amplifiers and/or other circuits.

BRIEF DESCRIPTION OF THE DRAWING

Like-numbered elements refer to common components in the different figures.

DETAILED DESCRIPTION

In a memory array with a cross-point type architecture, a first set of conductive lines runs across the surface of a substrate (e.g., word lines or WLs) and a second set of conductive lines run over the substrate in a direction perpendicular to the first set of conductive lines (e.g., bit lines or BLs). The memory cells are located at the cross-point junctions of the two sets of conductive lines. Embodiments for the memory cells can include a programmable resistance element, such as an MRAM element, which may be connected in series with a selector switch (selector) in a cross-point memory structure.

In some memory structures, including cross-point MRAM memory structures, memory cells may be formed in two or more stories (e.g., a first story formed between a first word line layer and a bit line layer and a second story formed between the bit line layer and a second word line layer). Accessing memory cells in such structures may be challenging. For example, where current direction is the same in both layers (e.g., current flowing upwards through memory cells), current flows from word lines to bit lines in the first story and flows from bit lines to word lines in the second story. This may require dedicated circuits (e.g., sense amplifiers) for each story.

According to aspects of the present technology, control circuits are provided to enable sense amplifiers to be used for nonvolatile memory cells of more than one story. For example, a sense amplifier may be connected to a bit line at a first time to sense a memory cell in the first story and may be connected to a word line at a second time to sense a memory cell in the second story. In this way, reading nonvolatile memory cells in multiple layers may be performed using the same sense amplifiers, which may reduce space used by sense amplifiers (e.g., half the number of sense amplifiers compared with dedicated sense amplifiers for each story).

Aspects of the present technology are directed to technical problems of efficient layout of circuits (including sense amplifiers and switches used to connect sense amplifiers to lines of a memory structure) in a data storage system. Technical solutions are provided to enable a common sense amplifier to connect to a bit line or a word line according to the location of a memory cell to be read (e.g., in a first story or a second story), which may significantly reduce the number of sense amplifiers needed (e.g., by 50%) and the space occupied by such sense amplifiers.

Figure 1:
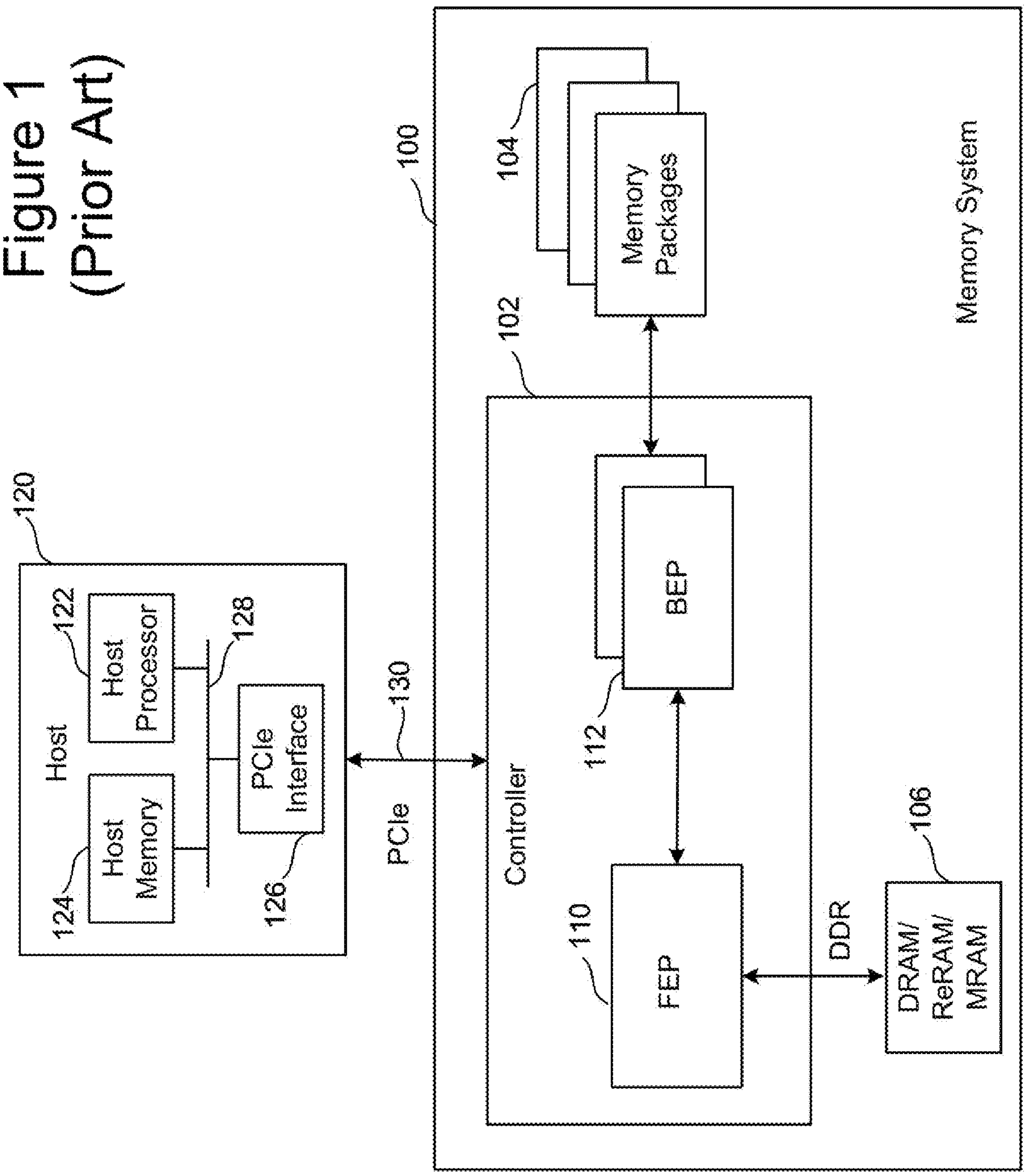
Figure 1 (Prior Art)
FIG. 1 is a block diagram of one embodiment of a memory system connected to a host.

FIG. 1 is a block diagram of one embodiment of a memory system 100 connected to a host 120. Memory system 100 can implement the technology presented herein for managing error rates. Many different types of memory systems can be used with the technology proposed herein. Example memory systems include solid state drives ("SSDs"), memory cards including dual in-line memory modules (DIMMs) for DRAM replacement, and embedded memory devices; however, other types of memory systems can also be used.

Memory system 100 of FIG. 1 comprises a controller 102, nonvolatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other nonvolatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, nonvolatile memory 104 comprises a plurality of memory packages. Each memory package includes one or more memory die. Therefore, controller 102 is connected to one or more nonvolatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In other embodiments, the BEP or FEP can be included on the memory die.

Controller 102 communicates with host 120 via an interface 130 that implements a protocol such as, for example, NVM Express (NVMe) or Compute Express Link (CXL) over PCI Express (PCIe) or using JEDEC standard Double Data Rate or Low-Power Double Data Rate (DDR or LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, MRAM, nonvolatile memory, or another type of storage. Host 120 is external to and separate from memory system 100. In one embodiment, memory system 100 is embedded in host 120.

Figure 2:
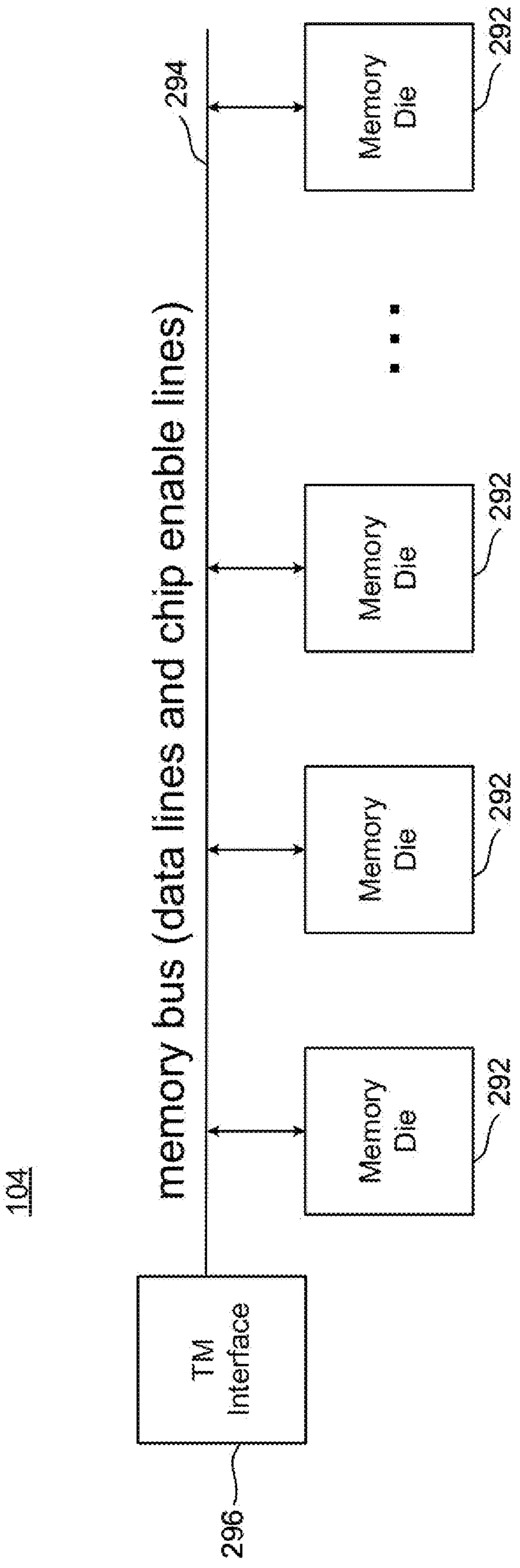
Figure 2 (Prior Art)
FIG. 2 is a block diagram of one embodiment of a memory package.

FIG. 2 is a block diagram of one embodiment of a memory package 104 that includes a plurality of memory die 292 connected to a memory bus 294 (data lines and chip enable lines). The memory bus 294 connects to a Toggle Mode Interface 296 for communicating with the TM Interface of a BEP circuit. In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 3:
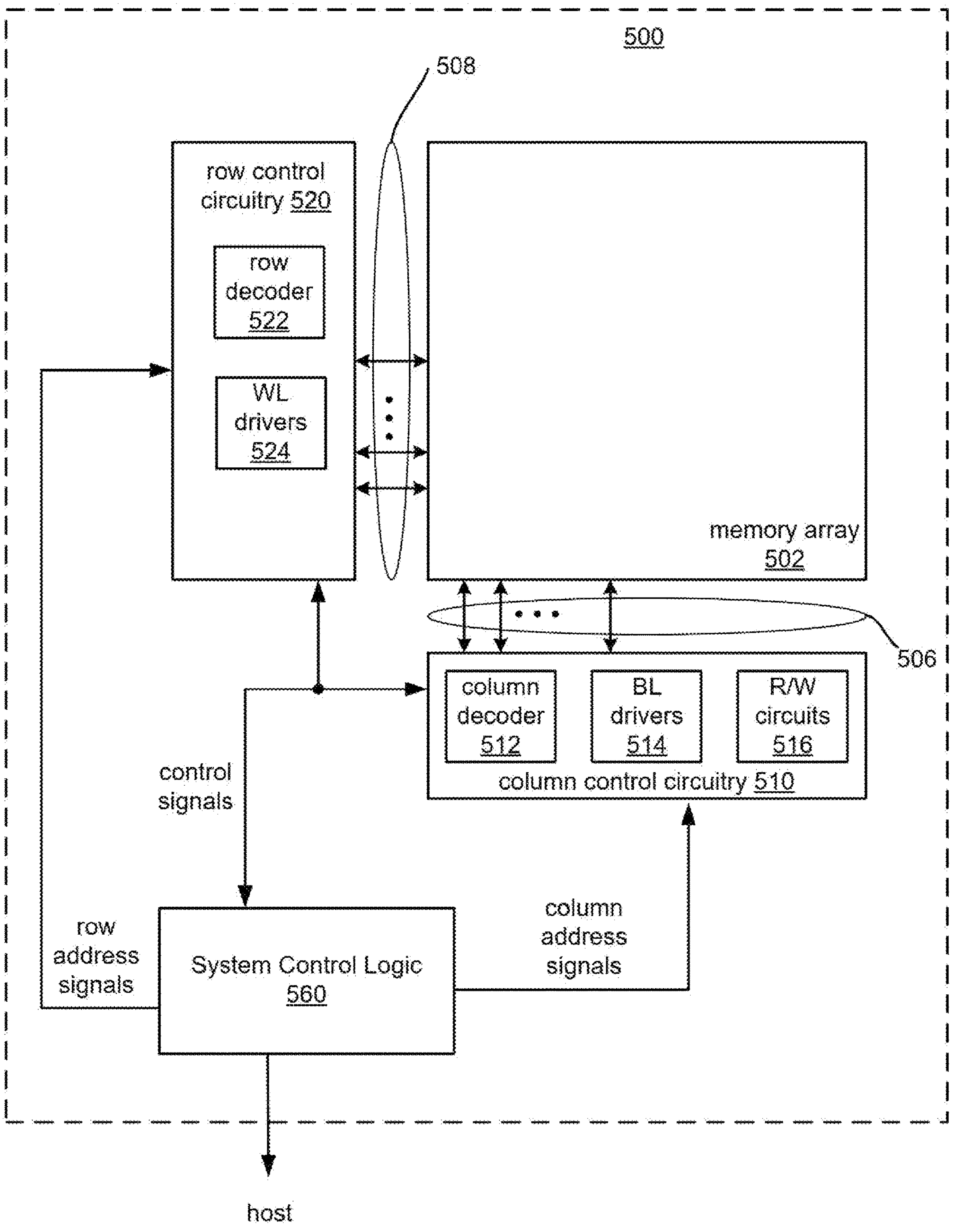
Figure 3 (Prior Art)
FIG. 3 is a block diagram of one embodiment of a memory die.

FIG. 3 is a block diagram that depicts one example of a memory system 500 that can implement the technology described herein. Memory system 500 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory system 500 includes row control circuitry 520, connected to respective word lines of the memory array 502 through lines 508. Row control circuitry 520 receives row address signals and one or more various control signals from system control logic 560, and typically may include such circuits as row decoders 522 and word line (WL) 1 drivers 524 for both reading and writing operations.

Memory system 500 also includes column control circuitry 510 whose input/outputs 506 are connected to respective bit lines of the memory array 502. Although only a single block is shown for memory array 502, a memory die can include multiple arrays or "tiles" that can be individually accessed. Column control circuitry 510 receives column address signals and one or more various control signals from System Control Logic 560, and typically may include such circuits as column decoders 512, bit line (BL) drivers 514, as well as read/write (R/W) circuits 516, which may include, for example, sense amplifiers for reading.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine that provides die-level control of memory operations. In one embodiment, the state machine is programmable by software. In other embodiments, the state machine does not use software and is completely implemented in hardware (e.g., electrical circuits). In another embodiment, the state machine is replaced by a micro-controller, with the micro-controller either on or off the memory chip. The system control logic 560 can also include a power control module, which controls the power and voltages supplied to the rows and columns of the memory array 502 during memory operations and may include charge pumps and regulator circuit for creating regulating voltages. System control logic 560 may include one or more state machines, registers and other control logic for controlling the operation of memory system 500.

In some embodiments, all of the elements of memory system 500, including the system control logic 560, can be formed as part of a single die (e.g., a memory die 292 of FIG. 2). In other embodiments, some or all of the system control logic 560 can be formed on a different die.

For purposes of this document, the phrase "one or more control circuits" can include a controller, a state machine, a micro-controller and/or other control circuitry as represented by the system control logic 560 and/or other analogous circuits that are used to control nonvolatile memory.

In one embodiment, memory structure 502 comprises a three dimensional memory array of nonvolatile memory cells in which multiple memory levels are formed above a single substrate, such as a wafer. The memory structure may comprise any type of nonvolatile memory that are monolithically formed in one or more physical levels of memory cells having an active area disposed above a silicon (or other type of) substrate. In another embodiment, memory structure 502 comprises a two dimensional memory array of nonvolatile memory cells.

The exact type of memory array architecture or memory cell included in memory structure 502 is not limited to any particular example. Many different types of memory array architectures or memory technologies can be used to form memory structure 502. Examples of suitable technologies for memory cells of the memory structure 502 include NAND flash memories, ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data using magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a programming current pulse. Note that the use of "pulse" in this document does not require a square pulse but includes a (continuous or non-continuous) vibration or burst of sound, current, voltage light, or other wave. Said memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3 can be grouped into two parts, the memory structure 502 (including the memory cells) and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 4:
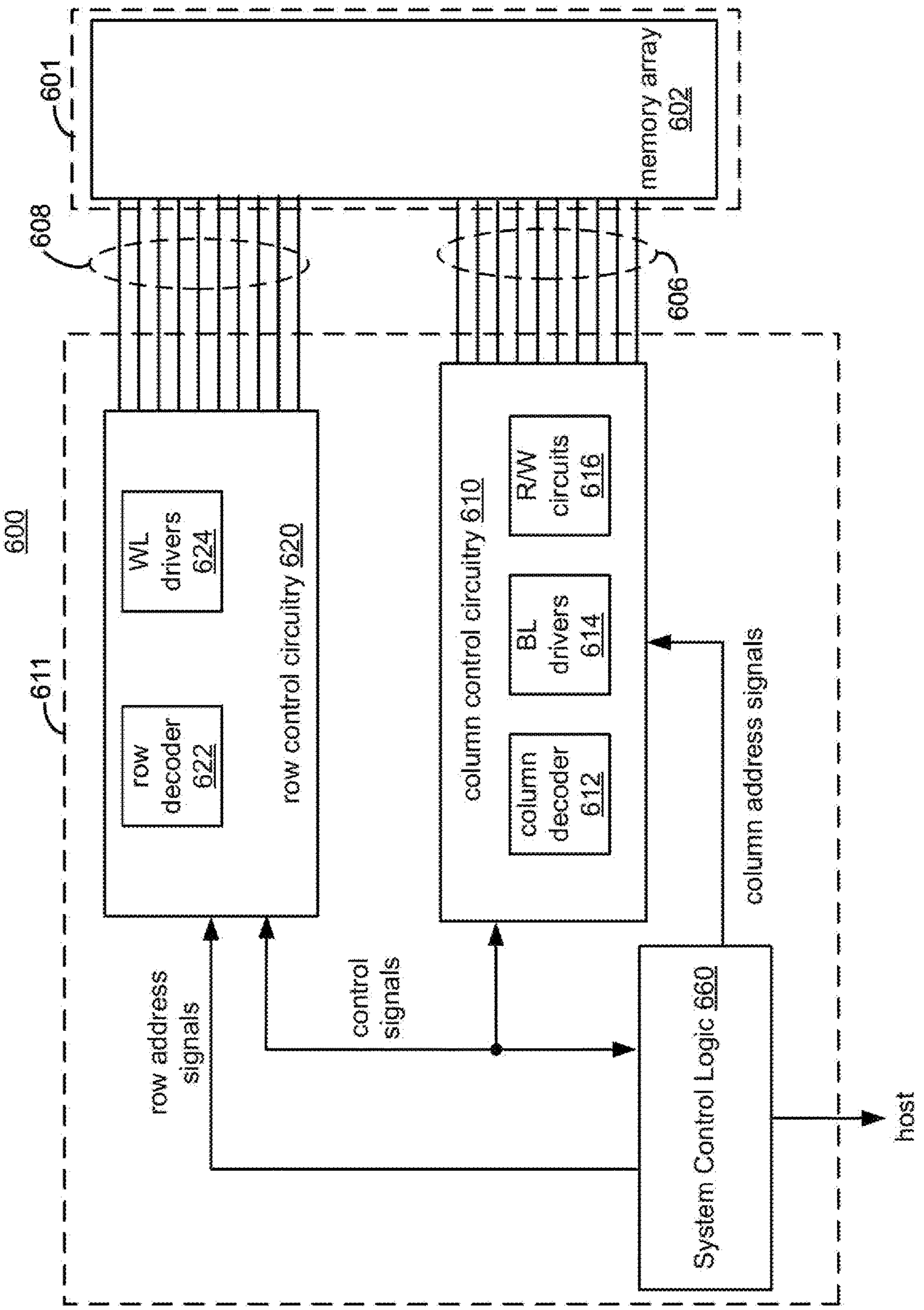
Figure 4 (Prior Art)
FIG. 4 is a block diagram of one embodiment of an integrated memory assembly.

FIG. 4 shows an alternative arrangement to that of FIG. 3, which may be implemented using wafer-to-wafer bonding to provide a bonded die pair for integrated memory assembly 600. FIG. 4 shows an example of the peripheral circuitry, including control circuits, formed in a peripheral circuit or control die 611 coupled to memory structure 602 formed in memory die 601. As with 502 of FIG. 3, the memory die 601 can include multiple independently accessible arrays or "tiles". Common components are labelled similarly to FIG. 3 (e.g., 502 is now 602, 510 is now 610, and so on). It can be seen that system control logic 660, row control circuitry 620, and column control circuitry 610 (which may be formed by a CMOS process) are located in control die 611. Additional elements, such as functionalities from controller 102, can also be moved into the control die 611. System control logic 660, row control circuitry 620, and column control circuitry 610 may be formed by a common process (e.g., CMOS process), so that adding elements and functionalities more typically found on a memory controller 102 may require few or no additional process steps (i.e., the same process steps used to fabricate controller 102 may also be used to fabricate system control logic 660, row control circuitry 620, and column control circuitry 610). Thus, while moving such circuits from a die such as memory die of memory system 500 may reduce the number of steps needed to fabricate such a die, adding such circuits to a die such as control die 611 may not require any additional process steps.

FIG. 4 shows column control circuitry 610 on the control die 611 coupled to memory structure 602 on the memory die 601 through electrical paths 606. For example, electrical paths 606 may provide electrical connection between column decoder 612, driver circuitry 614, and R/W circuits 616 and bit lines of memory structure 602. Electrical paths may extend from column control circuitry 610 in control die 611 through pads on control die 611 that are bonded to corresponding pads of the memory die 601, which are connected to bit lines of memory structure 602. Each bit line of memory structure 602 may have a corresponding electrical path in electrical paths 606, including a pair of bonded pads, which connects to column control circuitry 610. Similarly, row control circuitry 620, including row decoder 622, array drivers 624, and block select 626, are coupled to memory structure 602 through electrical paths 608. Each electrical path 608 may correspond to a word line, dummy word line, or select gate line. Additional electrical paths may also be provided between control die 611 and memory die 601.

Relative to FIG. 3, the on-die control circuits of FIG. 4 can include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 3 or on the control die 611 in FIG. 4 can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502/602 of FIGS. 3 and 4 will mainly be discussed in the context of a cross-point architecture, although much of the discussion can be applied more generally. The following discussion will mainly focus on embodiments based on a cross-point architecture using MRAM memory cells, although much of the discussion can be applied more generally to nonvolatile memory cells.

Figure 5:
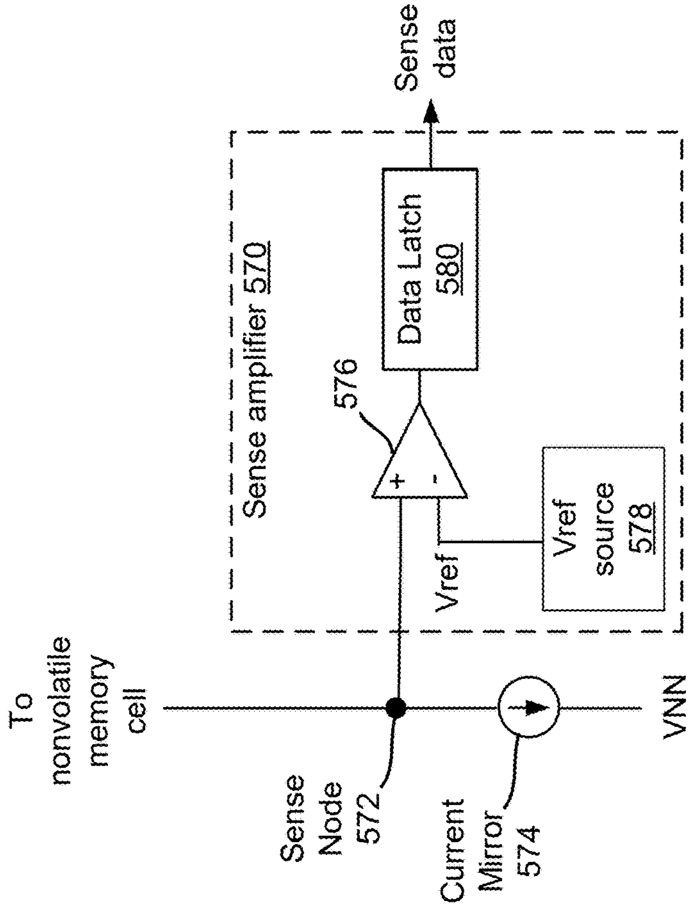
FIG. 5 shows an example of a sense amplifier.

FIG. 5 shows an example of a sense amplifier 570 (e.g., in read/write circuits 516 or 616). FIG. 5 shows a sense node 572 that may be connected to a selected nonvolatile memory cell (e.g., through a selected bit line that may be selected by column decoder 512 or 612). A current mirror 574 connected to a supply voltage, VNN, controls current through the selected nonvolatile memory cell during sensing. Sense amplifier 570 includes comparator 576 which receives a voltage from sense node 572 and compares it with a reference voltage (Vref) from a reference voltage source 578. For example, comparator 576 may generate a digital output (logic 1 or 0) depending on whether voltage at sense node 572 is above or below the reference voltage. The digital output from comparator 576 is latched in data latch 580 and output as sense data.

Figure 6:
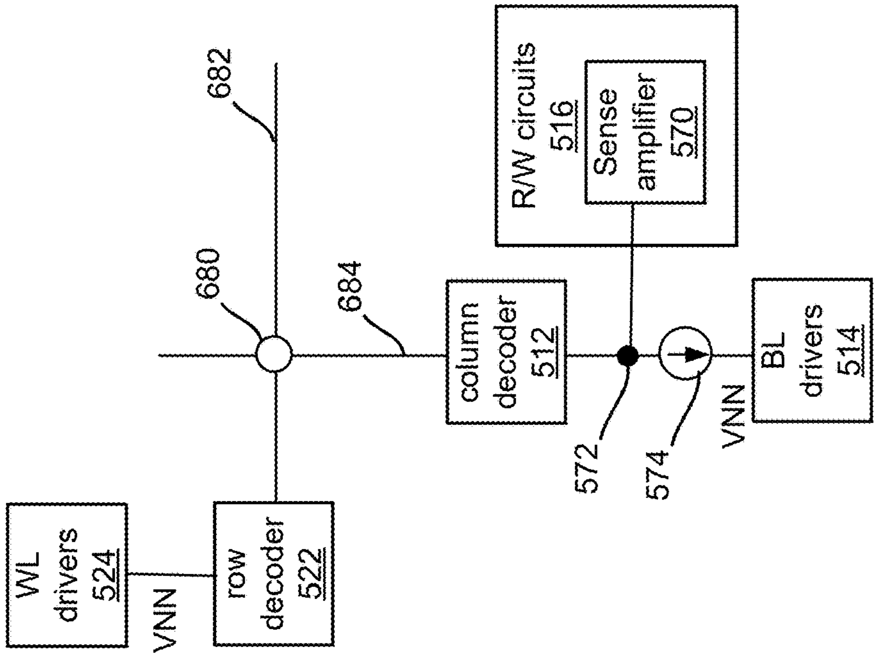
FIG. 6 shows an example of a memory access operation (read operation).

FIG. 6 illustrates a read operation directed to a selected memory cell 680, which is at the intersection of selected word line 682 and selected bit line 684 (e.g., in structure 502/602). Word line drivers 542 generate a first supply voltage, VPP (e.g., a positive voltage), which is then applied to selected word line 682 by row decoder 522. Column decoder 512 selects selected bit line 684 and connects it to sense node 572, where voltage is sensed by sense amplifier 570 as current flows through current mirror, which receives a second supply voltage VNN (e.g., a negative voltage) from bit line drivers 514. Sense amplifier 570 may sense the state of selected memory cell 680 from the voltage at sense node 572 while a predetermined current from current mirror 574 flows through selected memory cell 680.

Figure 7A:
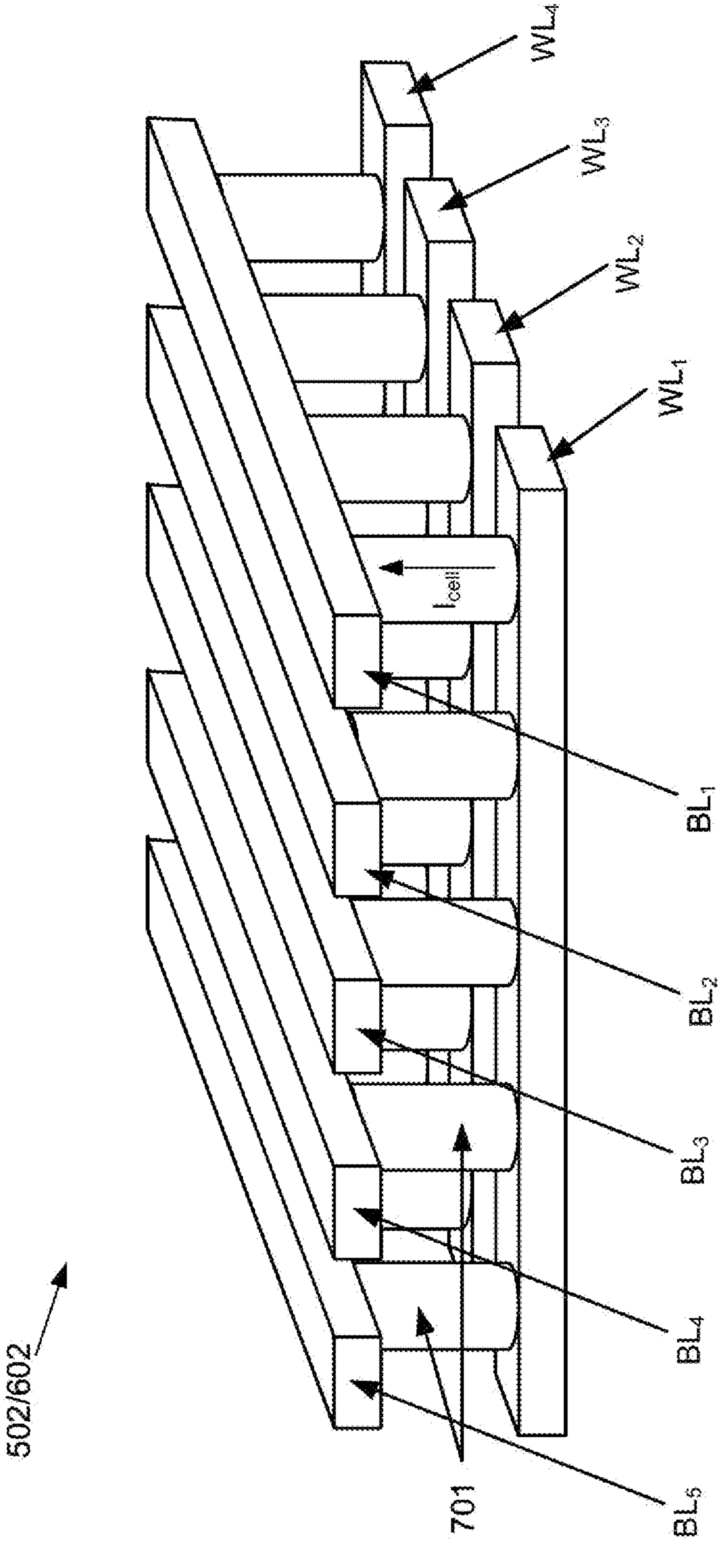
Figure 7A (Prior Art)
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502/602 of FIG. 7A is one example of an implementation for memory array 502 in FIG. 3 or 602 in FIG. 4, where a memory die can include multiple such array structures. The bit lines $BL_1$-$BL_5$ are arranged in a first direction (e.g., "bit line direction" represented as running into the page) relative to an underlying substrate (not shown) of the die and the word lines $WL_1$-$WL_5$ are arranged in a second direction (e.g., "word line direction") perpendicular to the first direction (across the page). FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502/602 includes a plurality of memory cells 701. The memory cells 701 may include re-writeable memory cells, such as can be implemented using ReRAM, MRAM, PCM, FeRAM, or other material with a programmable resistance. The current in the memory cells of the first memory level is shown as flowing upward as indicated by arrow $I_{cell}$, but current can flow in either direction, as is discussed in more detail in the following.

Figure 7B:
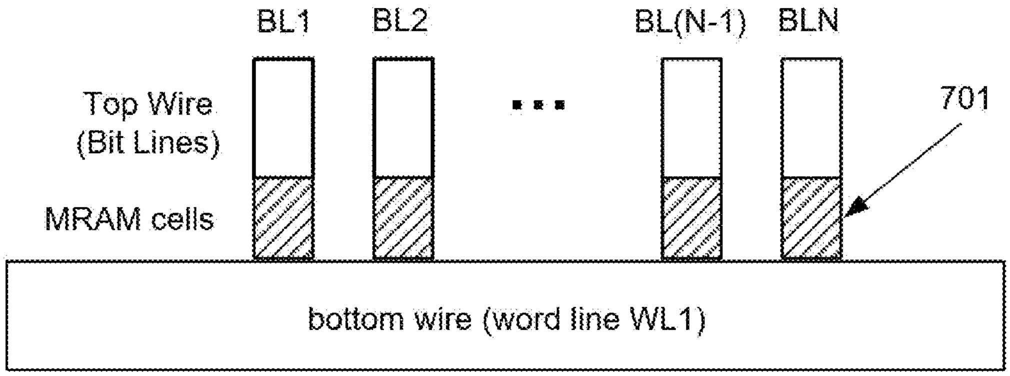
Figure 7B (Prior Art)
FIGS. 7B and 7C respectively present side and top views of the cross-point structure in FIG. 7A.
Figure 7C:
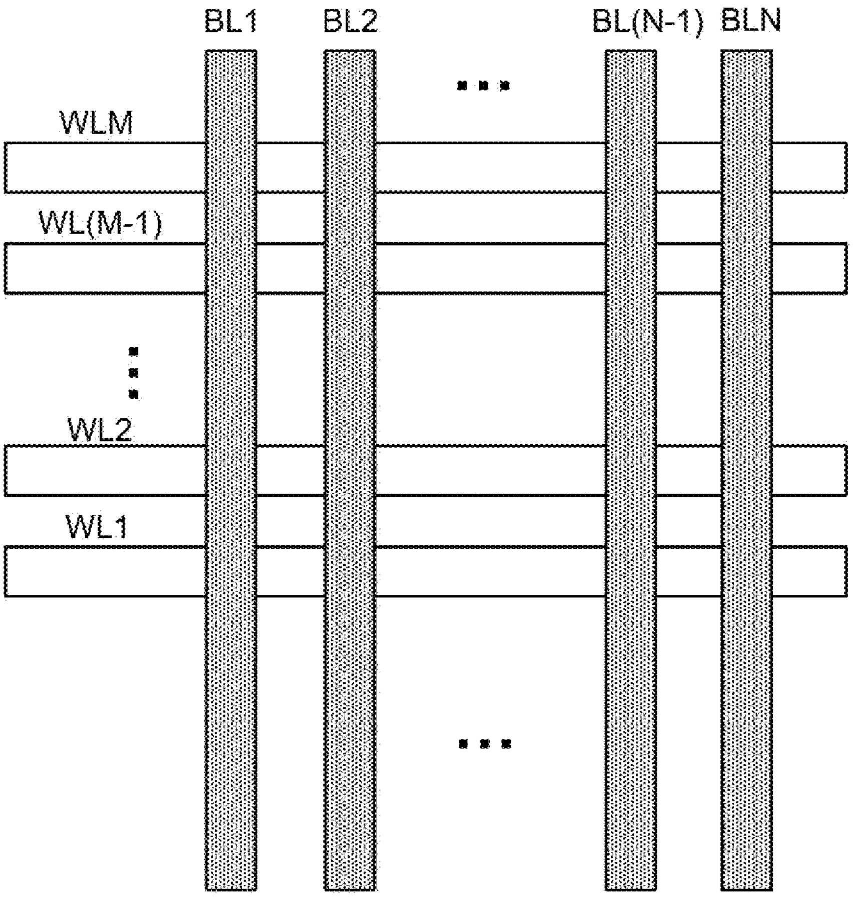
Figure 7C (Prior Art)

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell, although PCM, FeRAM, ReRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their programming are given below.

The cross-point array of FIG. 7A illustrates an embodiment with one layer (one story) of word lines and bits lines, with the MRAM or other memory cells sited at the intersection of the two sets of conducting lines. To increase the storage density of a memory die, multiple layers (stories) of such memory cells and conductive lines can be formed. A 2-layer (2-story) example is illustrated in FIG. 7D.

Figure 7D:
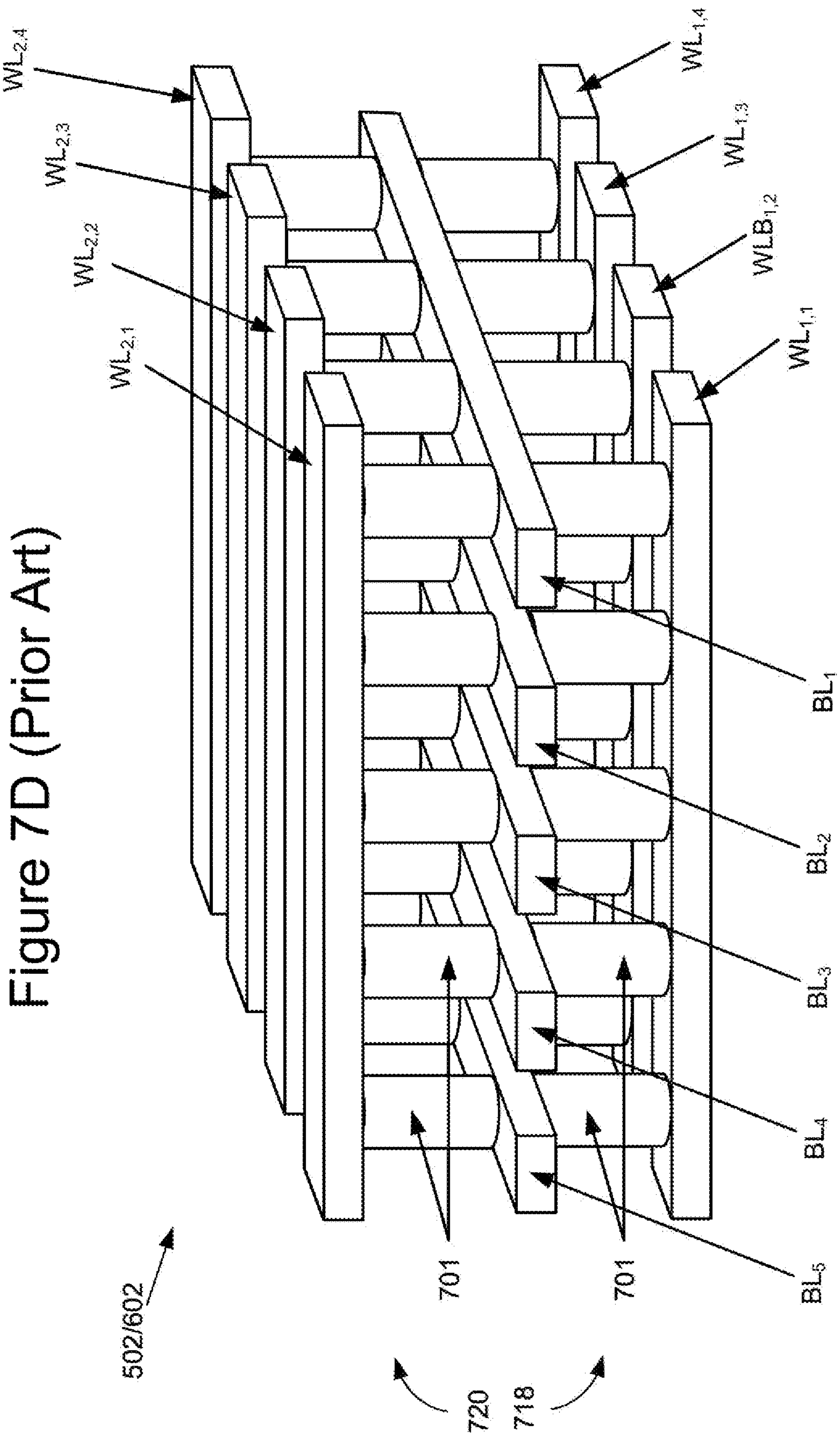
Figure 7D (Prior Art)
FIG. 7D depicts an embodiment of a portion of a two level memory array that forms a cross-point architecture in an oblique view.

FIG. 7D depicts an embodiment of a portion of a two level (two story) memory array that forms a cross-point architecture in an oblique view. As in FIG. 7A, FIG. 7D shows a first layer 718 (first story) of memory cells 701 of an array 502/602 connected at the cross-points of the first layer of word lines $WL_{1,1}$-$WL_{1,4}$ and bit lines $BL_1$-$BL_5$. A second layer (second story) of memory cells 720 is formed above the bit lines $BL_1$-$BL_5$ and between these bit lines and a second set of word lines $WL_{2,1}$-$WL_{2,4}$. Although FIG. 7D shows two layers (stories), 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used as the memory die 292 of FIG. 4, to replace local memory 106, or both.

Figure 8:
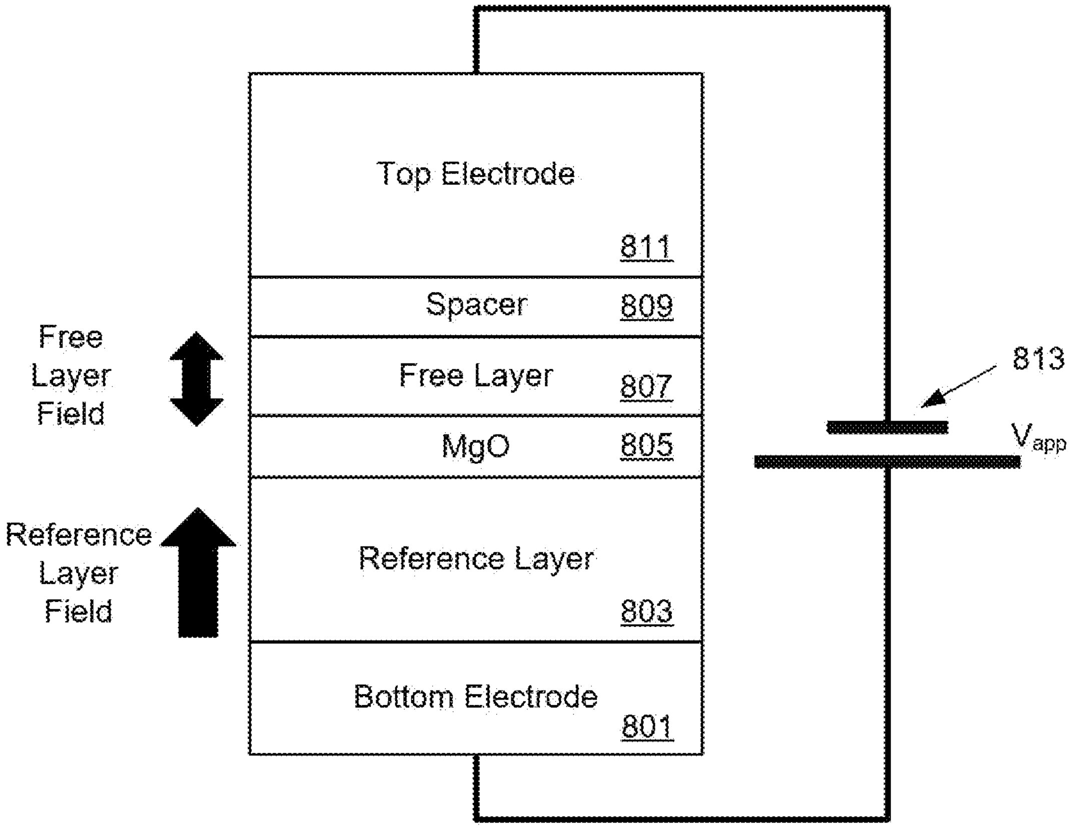
Figure 8 (Prior Art)
FIG. 8 illustrates an embodiment for the structure of an MRAM memory cell.

FIG. 8 illustrates an embodiment for the structure of an MRAM memory cell. A voltage being applied across the memory cell, between the memory cell's corresponding word line and bit line, is represented as a voltage source $V_{app}$ 813. The memory cell includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. The state of the memory cell is based on the relative orientation of the magnetizations of the reference layer 803 and the free layer 807: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 803 is fixed and, in the example of FIG. 15, is oriented upward. Reference layer 803 is also known as a fixed layer or pinned layer.

Data is written to an MRAM memory cell by programming the free layer 807 to either have the same orientation or opposite orientation. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

Figure 9:
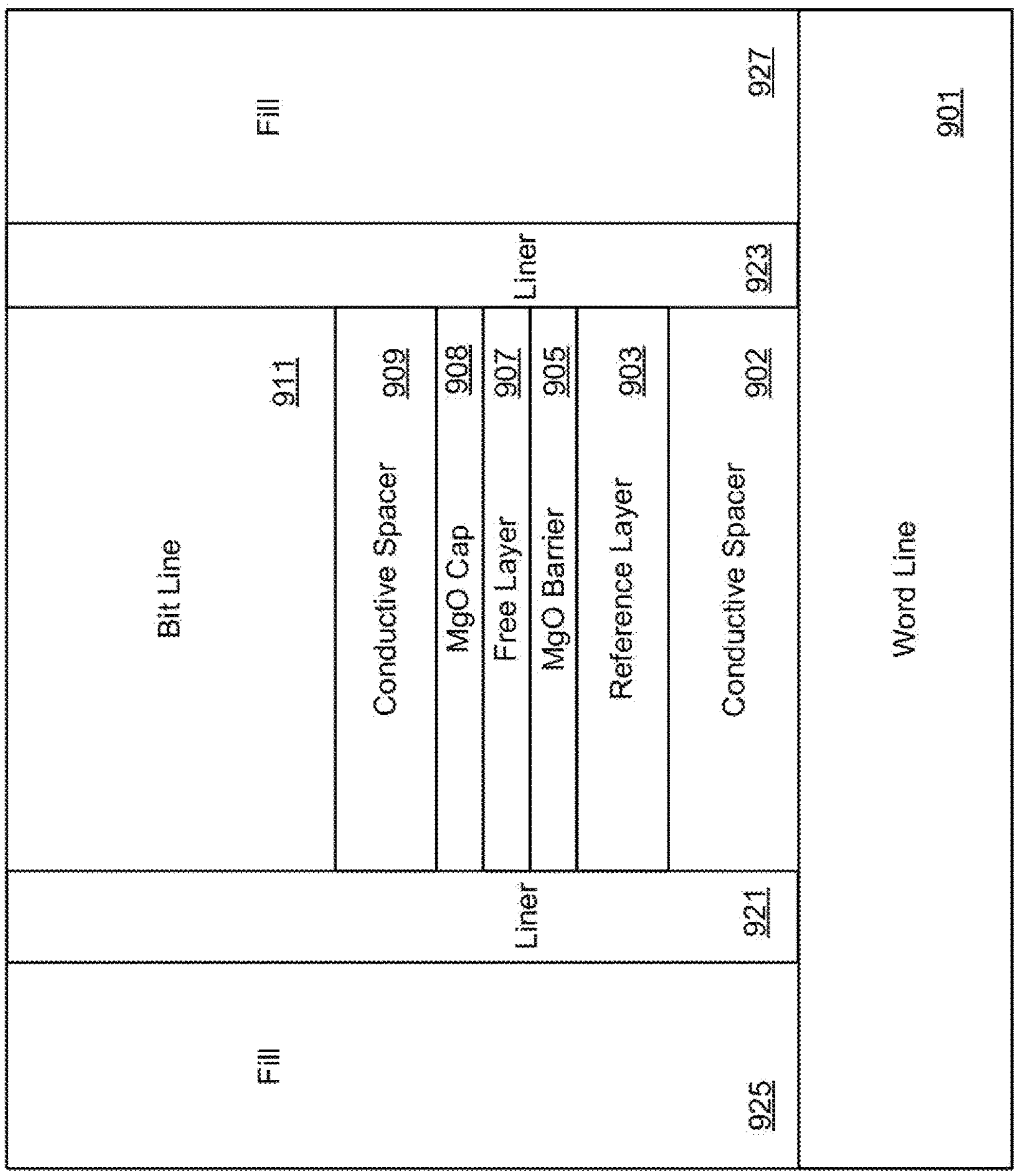
Figure 9 (Prior Art)
FIG. 9 illustrates an embodiment for an MRAM memory cell design as it would be implemented in a cross-point array in more detail.

FIG. 9 illustrates an embodiment for an MRAM memory cell design as it may be implemented in a cross-point array in more detail. When placed in a cross-point array, the top and bottom electrodes of the MRAM memory cells will be two of the adjacent layers of wires of the array, for example the top and bottom wires of the two level or two deck array. In the embodiment shown here, the bottom electrode is the word line 901 and the top electrode is the bit line 911 of the memory cell, but these can be reversed in some embodiments by reversing the orientation of the memory element. Between the word line 901 and bit line 911 are the reference layer 903 and free layer 907, which are again separated MgO barrier 905. In the embodiment shown in FIG. 9, a MgO cap 908 is also formed on top of the free layer 907 and a conductive spacer 909 is formed between the bit line 911 and the MgO cap 908. The reference layer 903 is separated from the word line 901 by another conductive spacer 902. On either side of the memory cell structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer 907, embodiments include CoFe or CoFeB Alloy with a thickness on the order ~1-2 nm, where an Ir layer can be interspersed in the free layer close to MgO barrier 905 and the free layer 907 can be doped with Ta, W, or Mo. Embodiments for the reference layer 903 can include a bilayer of CoFeB and CoPt multilayer coupled with an Ir or Ru spacer 902. The MgO cap 908 is optional but can be used to increase anisotropy of free layer 907. The conductive spacers can be conductive metals such as Ta, W, Ru, CN, TiN, and TaN, among others.

To sense a data state stored in an MRAM, a voltage is applied across the memory cell as represented by $V_{app}$ to determine its resistance state. For reading an MRAM memory cell, the voltage differential $V_{app}$ can be applied in either direction; however, MRAM memory cells have a directionality and, because of this, in some circumstances there is a preference for reading in one direction over the other. For example, the optimum current amplitude to write a bit into the AP (high resistance state, HRS) may be greater than that to write to the P (low resistance state) by 50% or more, so bit error rate (read disturb) is less probable if reading to AP (2AP). Some of these circumstances and the resultant directionality of a read are discussed below. The directionality of the biasing particularly enters into some embodiments for the programming of MRAM memory cells.

Figure 10A:
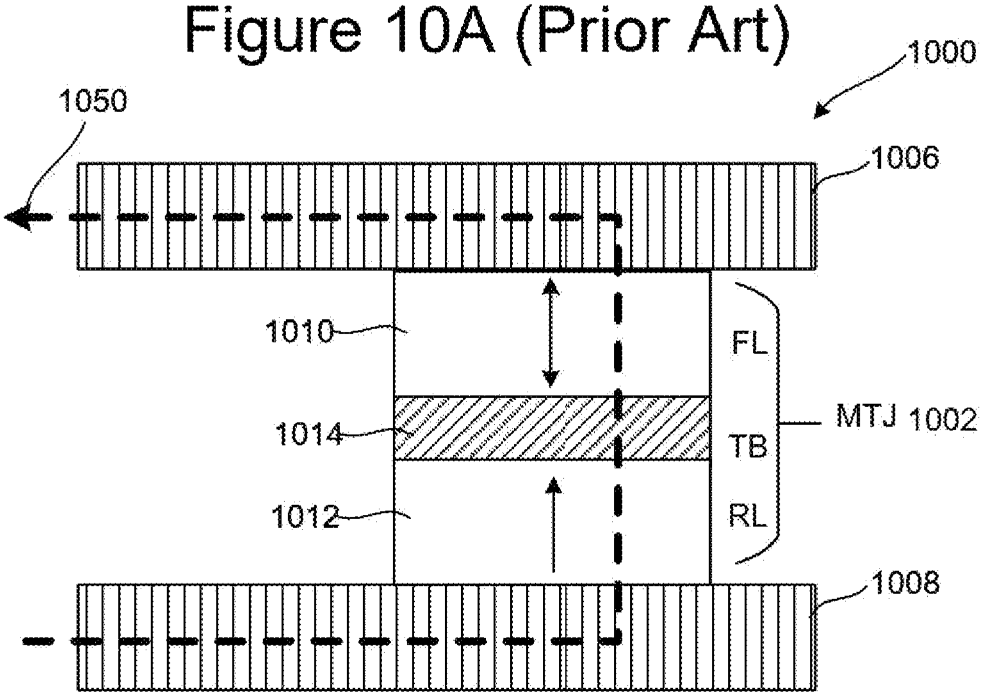
Figure 10A (Prior Art)
FIGS. 10A and 10B illustrate the writing of an MRAM memory cell by use of a spin torque transfer (STT) mechanism.
Figure 10B:
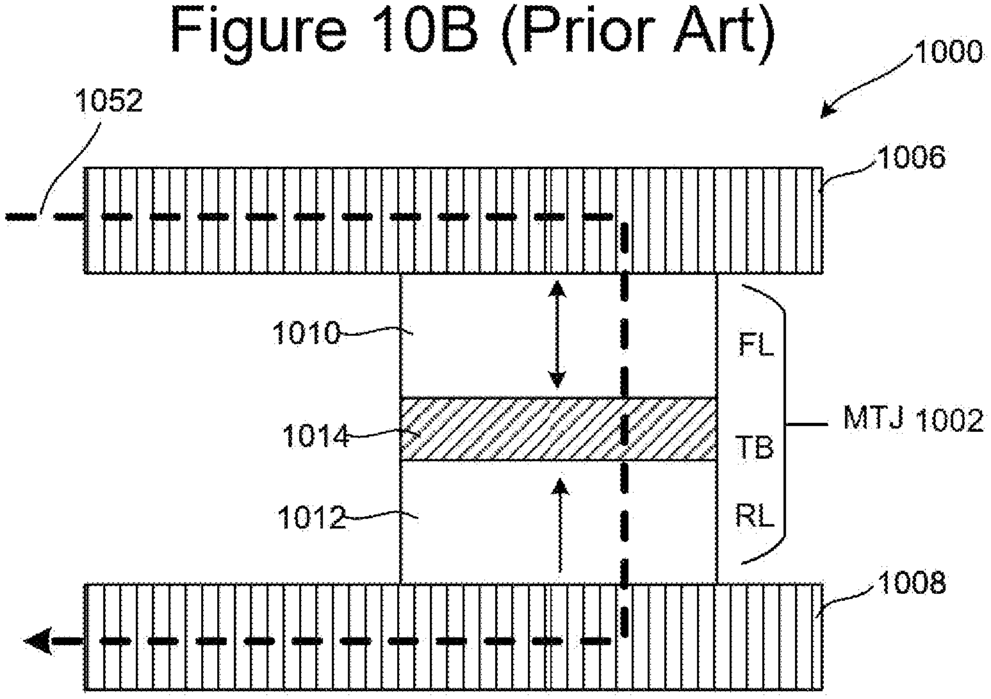
Figure 10B (Prior Art)

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the use of spin transfer torque to program or write to MRAM memory. Spin transfer torque magnetic random access memory (STT MRAM) has the advantages of lower power consumption and better scalability over MRAM variations such as toggle MRAM. Compared to other MRAM implementations, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms of electron behavior, FIGS. 10A and 10B and their discussion are given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing and reading of an MRAM memory cell using the STT mechanism, depicting a simplified schematic representation of an example of an STT-switching MRAM memory cell 1000 in which both the reference and free layer magnetization are in the perpendicular direction. Memory cell 1000 includes a magnetic tunnel junction (MTJ) 1002 comprising an upper ferromagnetic layer 1010, a lower ferromagnetic layer 1012, and a tunnel barrier 1014 (TB) as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in a perpendicular direction (i.e. perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is again perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron write current 1050 is applied from conductor 1008 to conductor 1006, as depicted in FIG. 10A. To generate the electron write current 1050, the top conductor 1006 is place at a higher voltage level than bottom conductor 1008, due to the negative charge of the electron. The electrons in the electron write current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron write current is turned off.

In contrast, if free layer 1010 and reference layer 1012 magnetizations are initially parallel, the direction of magnetization of free layer 1010 can be switched to become antiparallel to the reference layer 1012 by application of an electron write current of opposite direction to the aforementioned case. For example, electron write current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron write current direction (polarity).

The data ("0" or "1") in memory cell 1000 can be read by measuring the resistance of the memory cell 1000. Low resistance typically represents a "0" bit and high resistance typically represents a "1" bit, although sometimes the alternate convention occurs. A read current can being applied across the memory cell (e.g., across the magnetic tunnel junction 1002) by applying an electron read current from conductor 1008 to conductor 1006, flowing as shown for 1050 in FIG. 10A (the "AP2P direction"); alternatively, the electron read current can be applied from conductor 1006 to conductor 1008, flowing as shown for 1052 in FIG. 10B (the "P2AP direction"). In a read operation, if the electron write current is too high, this can disturb data stored in a memory cell and change its state. For example, if electron read current uses the P2AP direction of FIG. 10B, too high of a current or voltage level can switch any memory cells in the low resistance P state into the high resistance AP state. Consequently, although the MRAM memory cell can be read in either direction, the directional nature of the write operation may make one read direction preferable over the other in various embodiments as the P2AP direction since more current is required to write the bit in that direction.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding to a selected memory cell are biased to place a voltage across the selected memory cell and induce the flow of electrons as illustrated with respect to FIG. 10A or 10B. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array.

One approach to address this unwanted current leakage is to place a selector element in series with each MRAM or other resistive (e.g., ReRAM, PCM, and FeRAM) memory cell. For example, a select transistor can be placed in series with each resistive memory cell element in FIGS. 7A-7D so that memory cells 701 are now a composite of a selector and a programmable resistance. Use of a transistor, however, requires the introduction of additional control lines to be able to turn on the corresponding transistor of a selected memory cell. Additionally, transistors will often not scale in the same manner as the resistive memory element, so that as memory arrays move to smaller sizes the use of transistor based selectors can be a limiting factor.

An alternate approach to selector elements is the use of a threshold switching selector device in series with the programmable resistive element. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell at a cross-point, a voltage or current is applied which is sufficient to turn on the associated threshold switching selector and set or reset the memory cell; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS).

Figure 11:
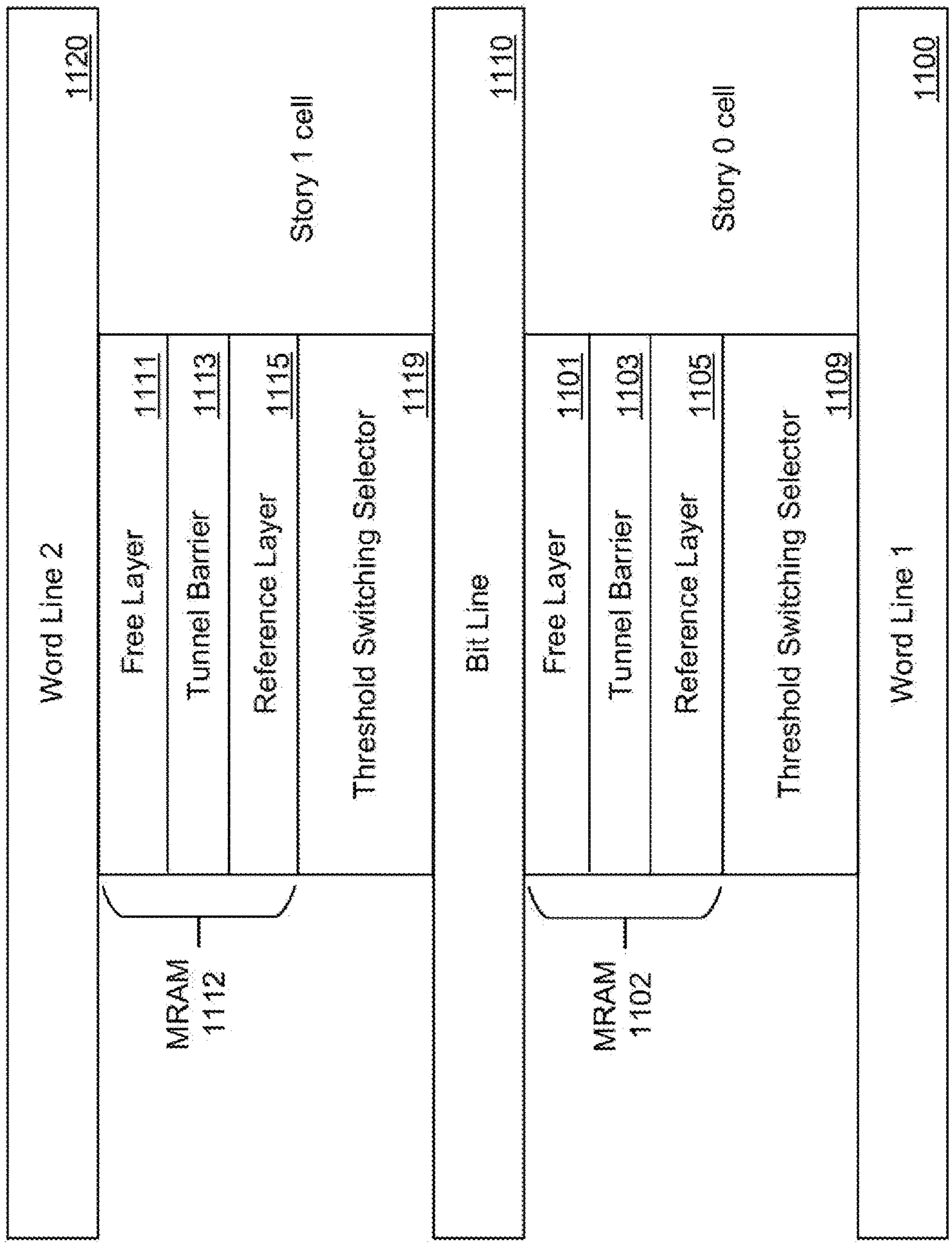
Figure 11 (Prior Art)
FIG. 11 illustrates an embodiment that includes threshold switching selectors in an MRAM memory array having a cross-point architecture.

FIG. 11 shows an embodiment that incorporates threshold switching selectors into an MRAM memory array having a cross-point architecture. The example of FIG. 11 shows two MRAM cells in a two layer (2-story) cross-point array, such as shown in FIG. 7D, but in a side view. FIG. 11 shows a lower first conducting line of word line 1 1100 (in a first or lower word line layer), an upper first conducting line of word line 2 1120 (in a second or upper word line layer), and an intermediate conducting line of bit line 1110 (in a bit line layer). In FIG. 11, all of these lines are shown running left to right across the page for ease of presentation. In a cross-point array they would be more accurately represented as in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM device 1102 including free layer 1101, tunnel barrier 1103, and reference layer 1105 is formed above the threshold switching selector 1109, where this series combination of the MRAM device 1102 and the threshold switching selector 1109 together form the Story 0 cell between the bit line 1110 and word line 1 1100. The series combination of the MRAM device 1102 and the threshold switching selector 1109 operate largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage above the threshold voltage Vth of the threshold switching selector 1109, and then the biasing current or voltage needs to be maintained high enough above the holding current or holding voltage of the threshold switching selector 1109 so that it stays on during the subsequent read or write operation.

In Story 1, an MRAM device 1112 includes free layer 1111, tunnel barrier 1113, and reference layer 1115 is formed above the threshold switching selector 1119, with the series combination of the MRAM device 1112 and the threshold switching selector 1119 together forming the Story 1 cell between the bit line 1110 and word line 2 1120. The Story 1 cell will operate as for the Story 0 cell, although the lower conductor now corresponds to a bit line 1110 and the upper conductor is now a word line, word line 2 1120.

In the embodiment of FIG. 11, the threshold switching selector 1109/1119 (selector) is formed below the MRAM device 1102/1112, so that selector 1109 is in contact with first word line 1100 of the first word line layer and MRAM device 1102 is formed between selector 1109 and bit line 1110. In alternate embodiments the threshold switching selector can be formed above the MRAM device for one or both layers. As discussed with respect to FIGS. 10A and 10B, the MRAM memory cell is directional. In FIG. 11, the MRAM devices 1102 and 1112 have the same orientation, with the free layer 1101/1111 above (relative to the unshown substrate) the reference layer 1105/1115. Forming the stories between the conductive lines with the same structure can have a number of advantages, particularly with respect to processing as each of the two stories, as well as subsequent stories in embodiments with more stories, can be formed according to the same processing sequence when forming a multi-story nonvolatile memory structure.

To either read data from or write data to an MRAM memory cell involves passing a current through the memory cell. In embodiments where a threshold switching selector is placed in series with the MRAM device, before the current can pass through the MRAM device the threshold switching selector needs to be turned on by applying a sufficient voltage across the series combination of the threshold switching selector and the MRAM device.

Figure 12A:
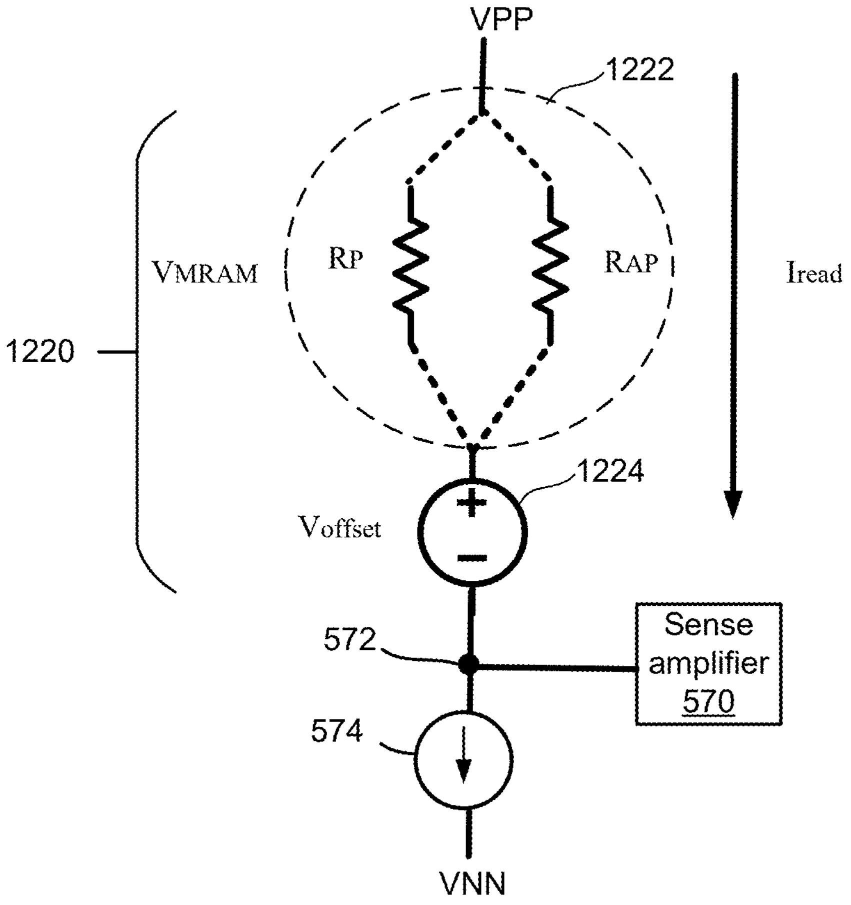
FIGS. 12A-B illustrate reading MRAM cells.

FIG. 12A shows a schematic of an example of reading a nonvolatile memory cell 1220 that includes an MRAM cell 1222 connected in series with a selector 1224. MRAM cell 1222 is illustrated schematically as two resistors having resistances $R_P$ and $R_{AP}$ corresponding to the resistance of MRAM cell 1222 in the parallel and anti-parallel states. A constant current, Iread, is maintained through MRAM cell 1222 during a read (e.g., by a current mirror such as current mirror 574) so that $V_{MRAM}$ may have two different values according to whether MRAM cell 1222 is in the parallel or anti-parallel state (e.g., $V_{MRAM}$=Iread*$R_P$ or $V_{MRAM}$=Iread*$R_{AP}$). Selector 1224 is represented schematically as a voltage source that provides a constant voltage difference, Voffset, when in the ON condition (e.g., once a threshold voltage exceeded). Sense amplifier 570 is connected to sense voltage at sense node 572 (e.g., voltage is different according to the resistance of MRAM cell 1222 and resulting voltage $V_{MRAM}$).

Figure 12B:
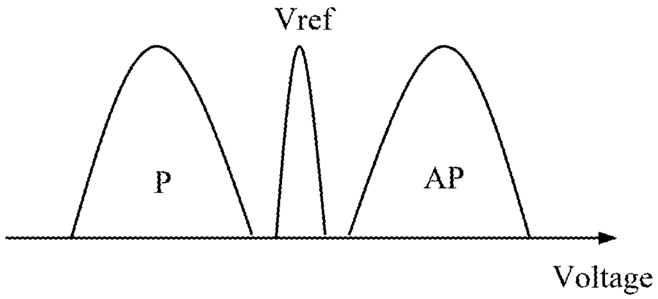

FIG. 12B illustrates voltage distributions that may be compared by a comparator of sense amplifier 570 (e.g., comparator 576) in a sense operation. A first voltage distribution marked "P" (e.g., at sense node 572) corresponds to MRAM cells in the parallel or "P" state. A second voltage distribution marked "AP" corresponds to MRAM cells in the anti-parallel or "AP" state. Between these distributions is a reference voltage, Vref (e.g., from Vref source 578). By comparing voltage at sense node 572 with reference voltage, Vref, a determination may be made as to which state a MRAM cell is in (e.g. sensed voltage<Vref indicates P state and sensed voltage>Vref indicates AP state).

In nonvolatile memory cells that include a selector connected in series with a MRAM cell, conventional current may flow from the selector side to the MRAM side. In a multi-story nonvolatile memory structure such as shown in FIG. 11, this may cause some differences in accessing nonvolatile memory cells in different stories.

Figure 13A:
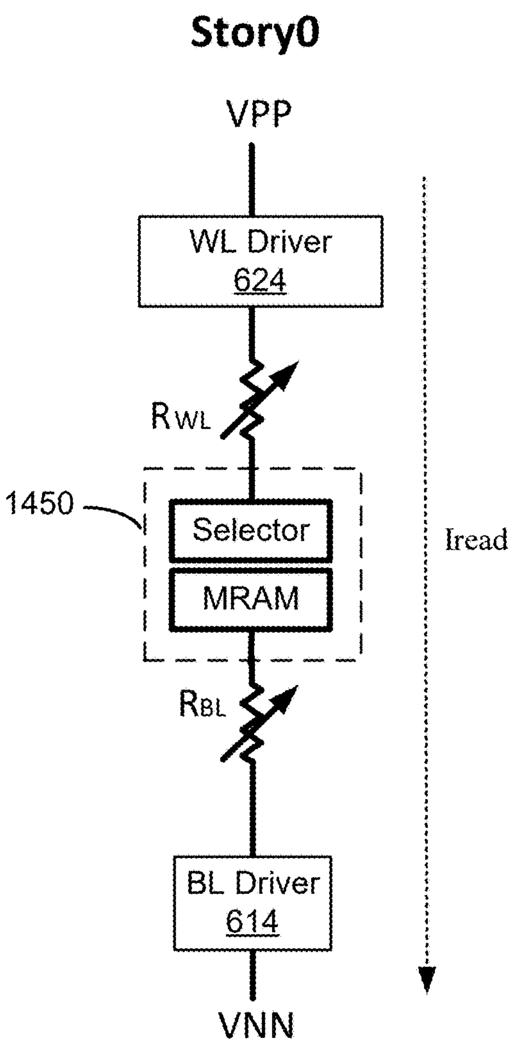
FIGS. 13A-B illustrate current flow in read operations of different stories in a multi-story nonvolatile memory structure.
Figure 13B:
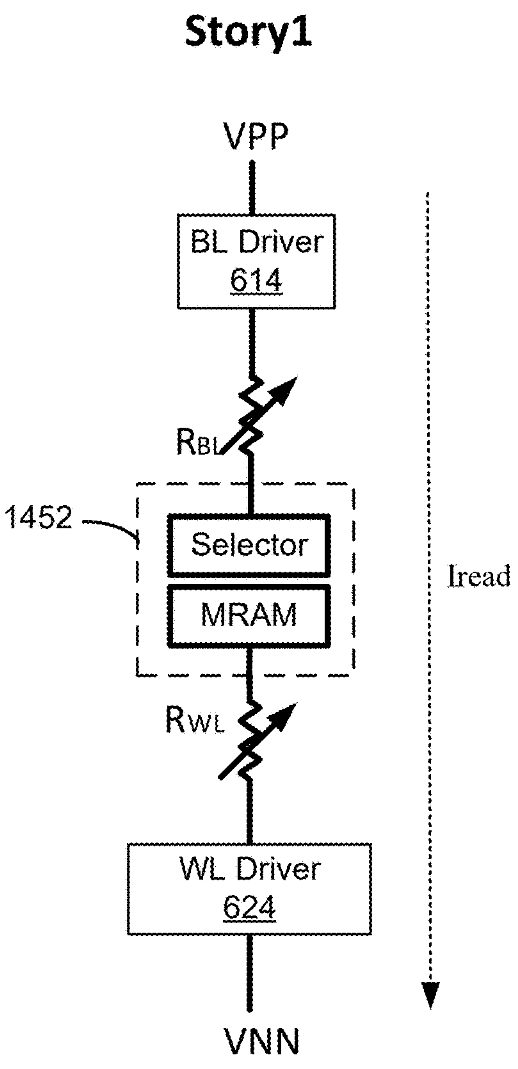

FIGS. 13A-B illustrate differences in accessing nonvolatile memory cells in different stories. In a first story (Story0 of FIG. 13A), current flows from the word line side to the bit line side. For example, FIG. 13A shows a positive voltage VPP applied to a selected word line (shown schematically as a variable resistance, $R_{WL}$) through WL driver 624 and a negative voltage, VNN, applied to a selected bit line (shown schematically as variable resistance, $R_{BL}$) so that current, Iread, flows from the word line side to the bit line side. In contrast, in a second story (Story1 of FIG. 13B), current flows from the bit line side to the word line side. For example, FIG. 13B shows a positive voltage VPP applied to a selected bit line ($R_{BL}$) through BL driver 614 and a negative voltage, VNN, applied to a selected word line ($R_{WL}$) so that current, Iread, flows from the bit line side to the word line side.

In order to read memory cells of different stories in a multi-story MRAM memory structure (e.g., as illustrated in FIG. 11), read/write circuits may include separate sense amplifiers for reading memory cells in each story. For example, FIGS. 14A-B show an example in which two different sense amplifiers are used for reading nonvolatile memories in different stories.

Figure 14A:
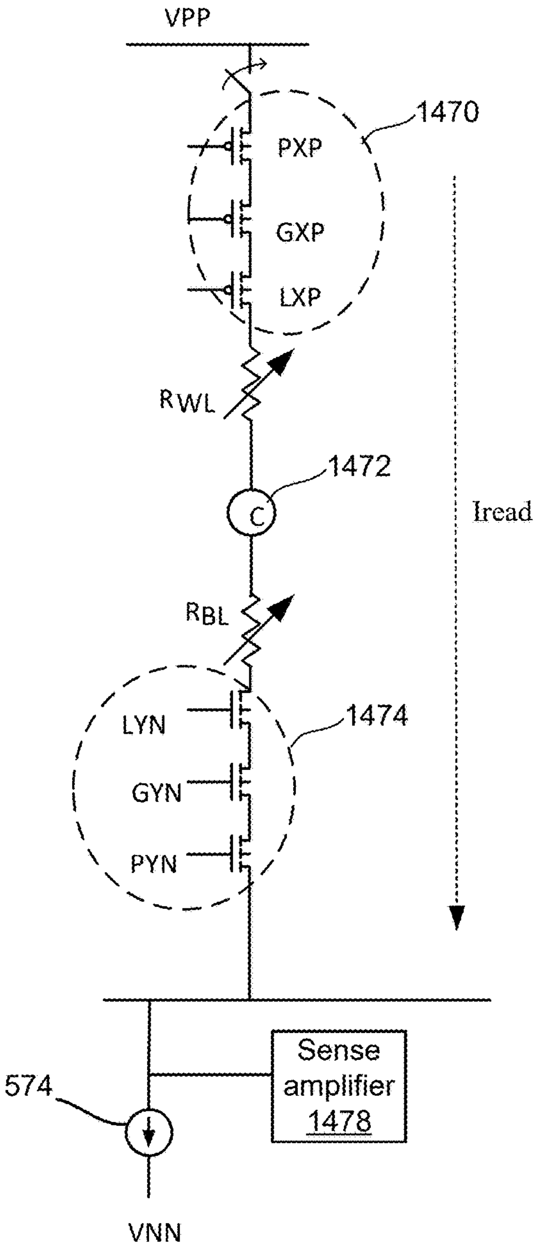
FIGS. 14A-B illustrate an example that includes different sense amplifiers for different stories.

FIG. 14A shows an example of a read operation directed to a nonvolatile memory cell in a first story (Story0 read), for example, Story0 cell of FIG. 11. A positive voltage, VPP, is connected through switches 1470 (e.g., switches of a WL decoder) and a selected word line (e.g., first word line 1100, shown schematically as variable resistance $R_{WL}$) to selected nonvolatile memory cell 1472. A selected bit line (e.g., bit line 1110, shown schematically as $R_{BL}$) connects selected nonvolatile memory cell 1472 through switches 1474 (e.g., switches of a BL decoder) to current mirror 574, which is connected to a negative voltage, VNN, and is configured to maintain a read current, Iread, during a read operation. A low voltage sense amplifier 1478 is connected to sense voltage between the selected bit line and current mirror 574 (e.g., low voltage sense amplifier 1478 may be configured to sense low voltages, including negative voltages, for example, in the range of −2.5 volts to −3.0 volts).

Figure 14B:
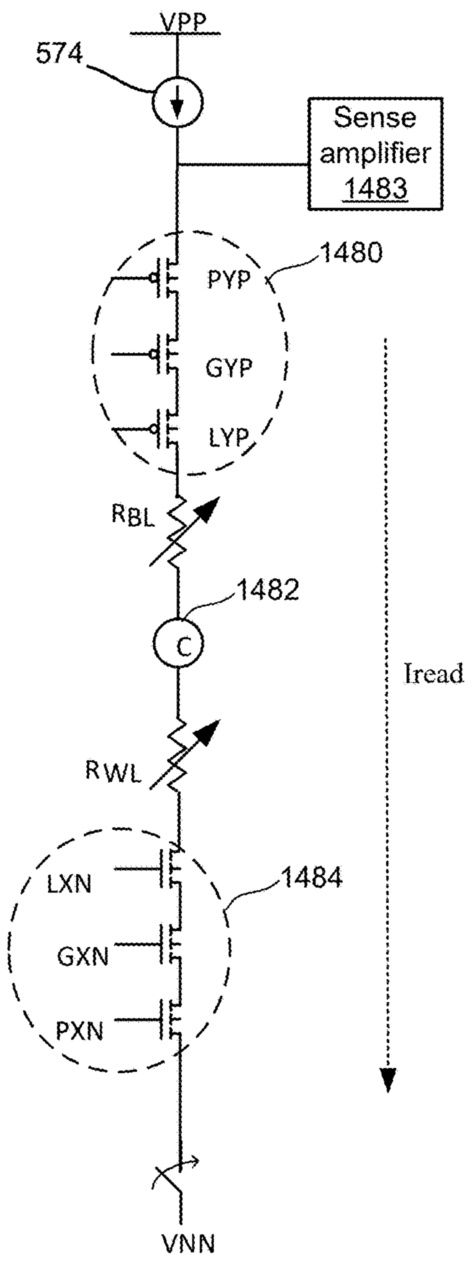

FIG. 14B shows an example of a read operation directed to a nonvolatile memory cell in a second story (Story1 read), for example Story1 cell of FIG. 11. A positive voltage, VPP, is connected through switches 1480 and selected bit line (e.g., bit line 1110, shown schematically as $R_{BL}$) to selected nonvolatile memory cell 1482. A selected word line (e.g., word line 1120, shown schematically as $R_{WL}$) connects selected nonvolatile memory cell 1482 through switches 1484 to a negative voltage, VNN. A high voltage sense amplifier 1483 is connected to sense voltage between the selected bit line and current mirror 574 (e.g., high voltage sense amplifier 1483 may be configured to sense high voltages, including positive voltages, for example in the range of 2.5 volts to 3.0 volts).

Aspects of the present technology include using a single sense amplifier to perform sensing during read operations directed to memory cells of two different stories (e.g., as illustrated in FIG. 11) where current flow is different for reading memory cells of different stories (e.g., word line to bit line in a first story, story0, and bit line to word line in a second story, story1).

Figure 15A:
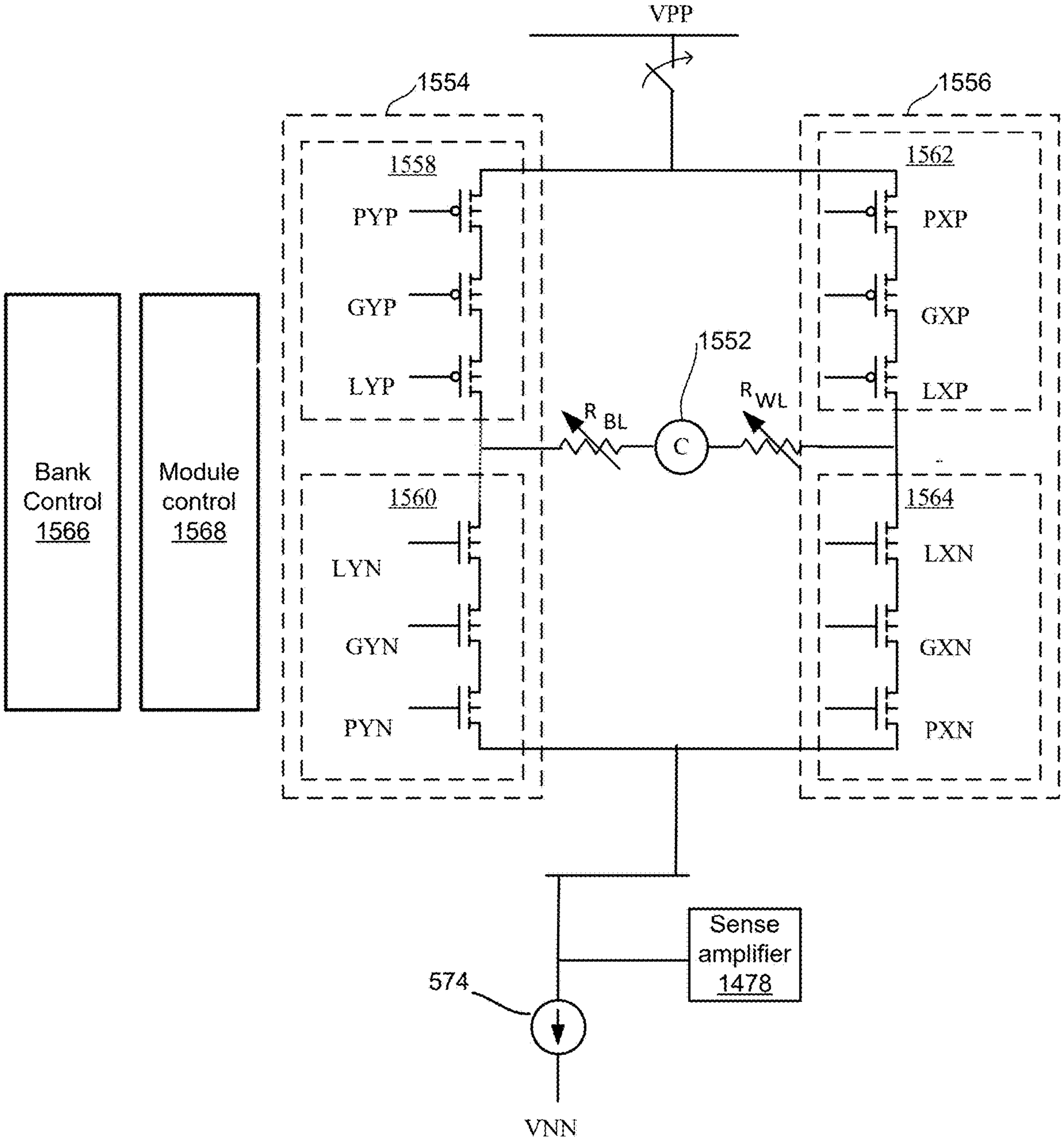
FIGS. 15A-C illustrate aspects of the present technology including a sense amplifier and control circuits configured to enable the sense amplifier to read nonvolatile memory cells in different stories.

FIG. 15A shows an example of control circuits connected to a nonvolatile memory cell 1552 (e.g., a nonvolatile memory cell in any story in an MRAM memory structure, for example, as illustrated in FIG. 11. Nonvolatile memory cell 1552 is connected to a bit line ($R_{BL}$) and a word line ($R_{WL}$), which are connected respectively to bit line switches 1554 and word line switches 1556. Bit line switches 1554 includes a first set of switches 1558 connected between a first voltage, VPP (e.g., a positive voltage), and the bit line and a second set of switches 1560 connected between the bit line and sense amplifier 1478. Word line switches 1556 include a third set of switches 1562 connected between the first voltage, VPP, and the word line and a fourth set of switches 1564 connected between the word line and sense amplifier 1478. Individual switches may correspond to different scales of switching and type of transistor. For example, the first letter indicated next to each transistor/switch may indicate scale (e.g., L=Local, G-Global and P=Plane). The second letter indicates whether it is connected to lines that extend in the x or y direction (e.g., Y for bit lines and X for word lines). The third letter indicates the type of transistor (e.g., P for PMOS and N for NMOS so that first and third switches 1558 and 1562 are formed by PMOS transistors and second and fourth switches 1560 and 1564 are formed by NMOS transistors). FIG. 15A also shows bank control circuit 1566 and module control circuit 1568, which may control signals used to turn on/off bit line switches 1554 and word line switches 1556. For example, control gates of transistors of the first, second, third and fourth sets of transistors may be connected to module control circuit 1568 and/or bank control circuit 1566 (control lines are omitted for clarity). Sense amplifier 1478 is connected above current mirror 574, which is connected to a second voltage, VNN (e.g., a negative voltage).

Figure 15B:
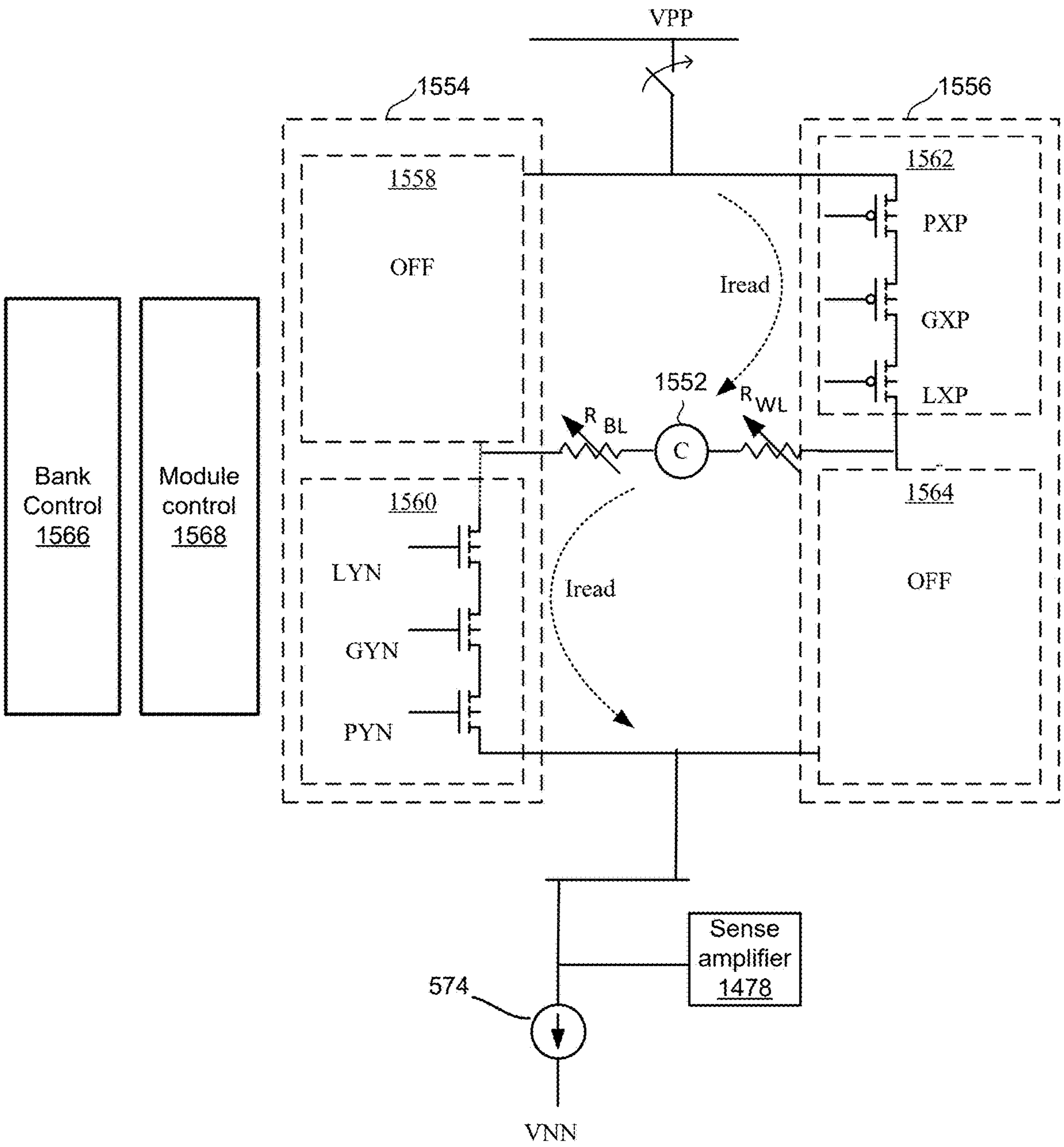

FIG. 15B shows an example of a read operation directed to a first nonvolatile memory cell 1552 in a first story (e.g., Story0 cell in FIG. 11). In this example, first voltage VPP (e.g., positive voltage) is connected through the selected word line to first nonvolatile memory cell 1552 by turning on third switches 1562. Sense amplifier 1478 and first voltage VNN (e.g., negative voltage) are connected to first nonvolatile memory cell 1552 through the bit line by turning on second switches 1560. First switches 1558 and fourth switches 1564 are turned off for this read operation. In this configuration, read current, Iread, flows through switches 1562, the selected bit line, first nonvolatile memory cell 1552, the selected bit line, switches 1560 and current mirror 574 as illustrated by dotted arrows. Sense amplifier 1478 senses voltage above current mirror 574 to determine the state of first nonvolatile memory cell 1552.

Figure 15C:
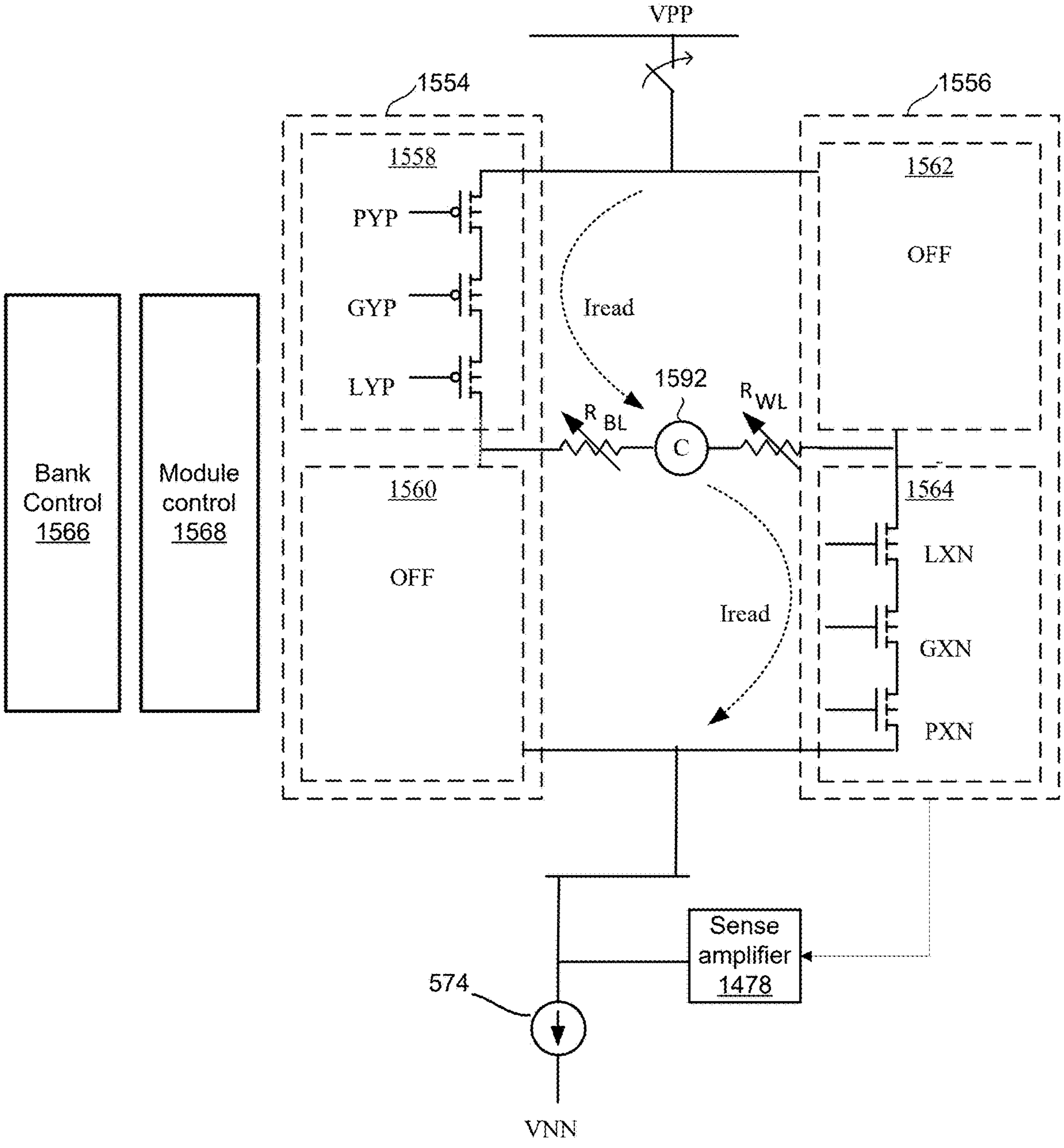

FIG. 15C shows an example of a read operation directed to a second nonvolatile memory cell 1592 in a second story (e.g., Story1 cell in FIG. 11). In this example, first voltage VPP (e.g., positive voltage) is connected through the selected bit line to second nonvolatile memory cell 1592 by turning on first switches 1558. Sense amplifier 1478 and first voltage VNN (e.g., negative voltage) are connected to second nonvolatile memory cell 1592 through the word line by turning on fourth switches 1564. Switches 1560 and switches 1562 are turned off for this read operation. In this configuration, read current, Iread, flows through switches 1558, the selected bit line, second nonvolatile memory cell 1592, the selected word line, switches 1564 and current mirror 574 as illustrated by dotted arrows. Sense amplifier 1478 senses voltage above current mirror 574 to determine the state of second nonvolatile memory cell 1592.

Bank control circuit 1566 and/or module control circuit 1568 (e.g., in combination with other control circuits such as system control logic 560/660) may control first, second, third and fourth switches 1558, 1560, 1562 and 1564 to configure connections as shown in FIG. 15B when reading memory cells in a first story (e.g., Story0) and as shown in FIG. 15C when reading memory cells in a second story (e.g., Story1). For example, control circuits (e.g., bank control circuit 1566, module control circuit 1568 and/or system control logic 560/660) may receive addresses of selected nonvolatile memory cells and for each selected nonvolatile memory cell determine a story in which the selected nonvolatile memory cell is located from a plurality of stories including a first story between a first word line layer and a bit line layer (e.g., Story0 between Word line 1 1100 and Bit line 1110 in FIG. 11) and a second story between the bit line layer and a second word line layer (e.g., Story1 between Bit Line 1110 and Word Line 2 1120). The control circuits may then apply suitable voltages to first, second, third and fourth switches to perform configuration according to the stories in which nonvolatile memory cells are located. Bank control circuits 1566, module control circuits 1568, bit line switches 1554 and word line switches 1556 (alone or in combination with additional switches such as system control logic 560/660) may be considered examples of means for reading nonvolatile memory cells that are located in a plurality of stories including a first story between a first word line layer and a bit line layer (e.g., Story0 of FIG. 11) and a second story between the bit line layer and a second word line layer (e.g., Story of FIG. 11) including connecting a sense amplifier to a first selected nonvolatile memory cell in the first story through a bit line of the bit line layer (e.g., see FIG. 15B) and connecting the sense amplifier to a second selected nonvolatile memory cell in the second story through a second word line of the second word line layer (e.g., see FIG. 15C). While the examples of FIGS. 15B-C refer to read operations, any memory access operation (e.g., write operations) may be similarly applied to memory cells in different stories using aspects of the present technology.

Figure 16:
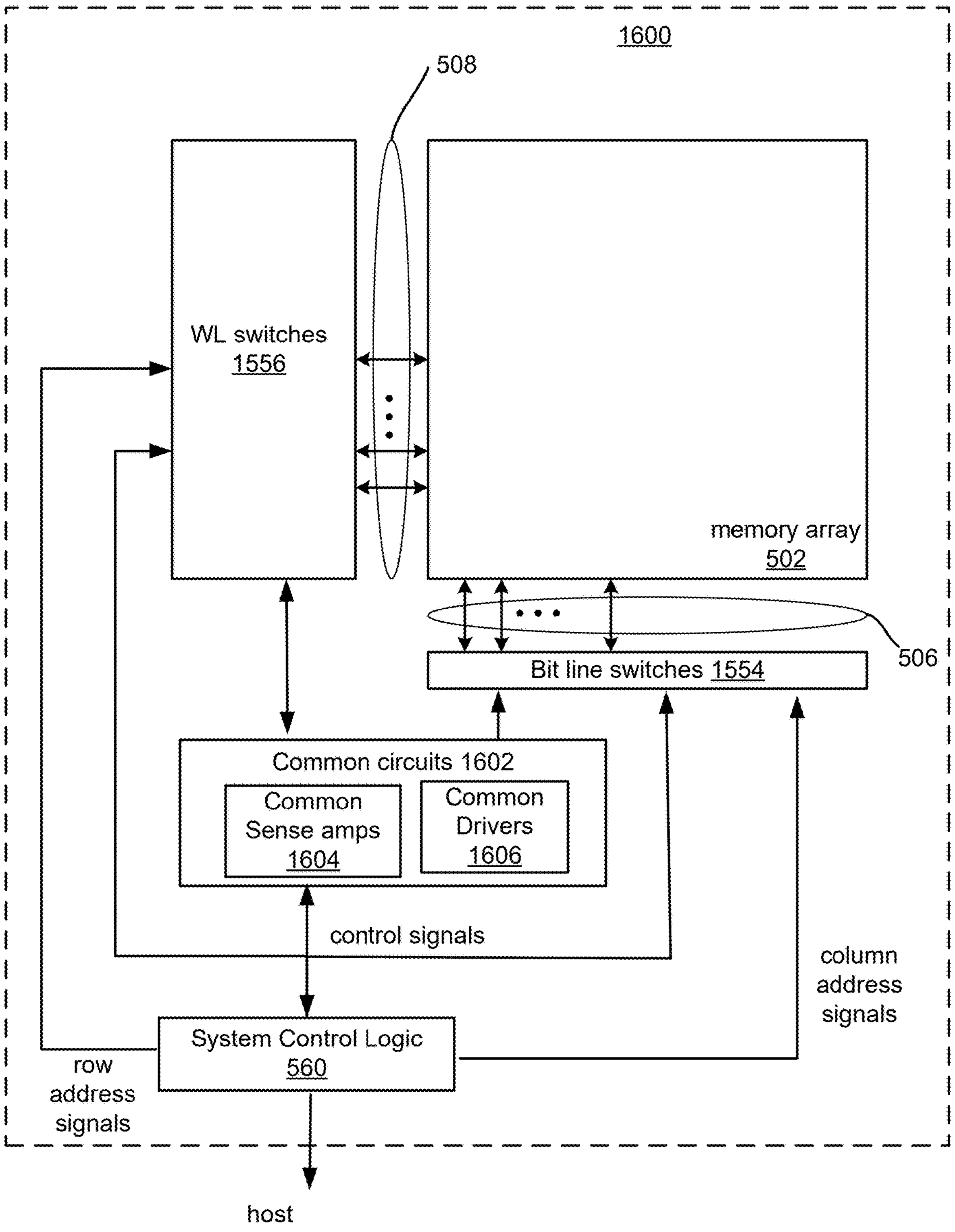
FIG. 16 illustrates an example of a memory die that includes common sense amplifiers.

FIG. 16 shows a simplified schematic of a memory die 1600 that implements aspects of the present technology. For example, FIG. 16 shows bit line switches 1554 connected to bit lines of memory array 502 through input/outputs 506 and word line switches 1556 connected to word lines of memory array 502 through input/output lines 508. Bit line switches 1554 and word line switches 1556 are connected to common control circuits 1602, which include common sense amplifiers 1604 and common drivers 1606. For example, each sense amplifier of common sense amplifiers 1604 may be connected to either a bit line (through bit line switches 1554) or a word line (through word line switches 1556) and in this way may be used for sensing nonvolatile memory cells in different stories. Similarly, each driver of common drivers 1606 may be connected to either a bit line (through bit line switches 1554) or a word line (through word line switches 1556) and in this way may be used to drive appropriate voltages (e.g., VPP and VNN) on either a bit line or a word line. In this way, common drivers 1606 may be used for read operations directed to memory cells in different stories. Other components of memory die 1600 may be similar to components of memory system 500 and are not further described here. An integrated memory assembly may be implemented using WL switches, bit line switches and common circuits that may be connected to either (e.g., integrated memory assembly 600 may be configured to include word line switches 1665, bit line switches 1554 and common control circuits 1602.

Figure 17:
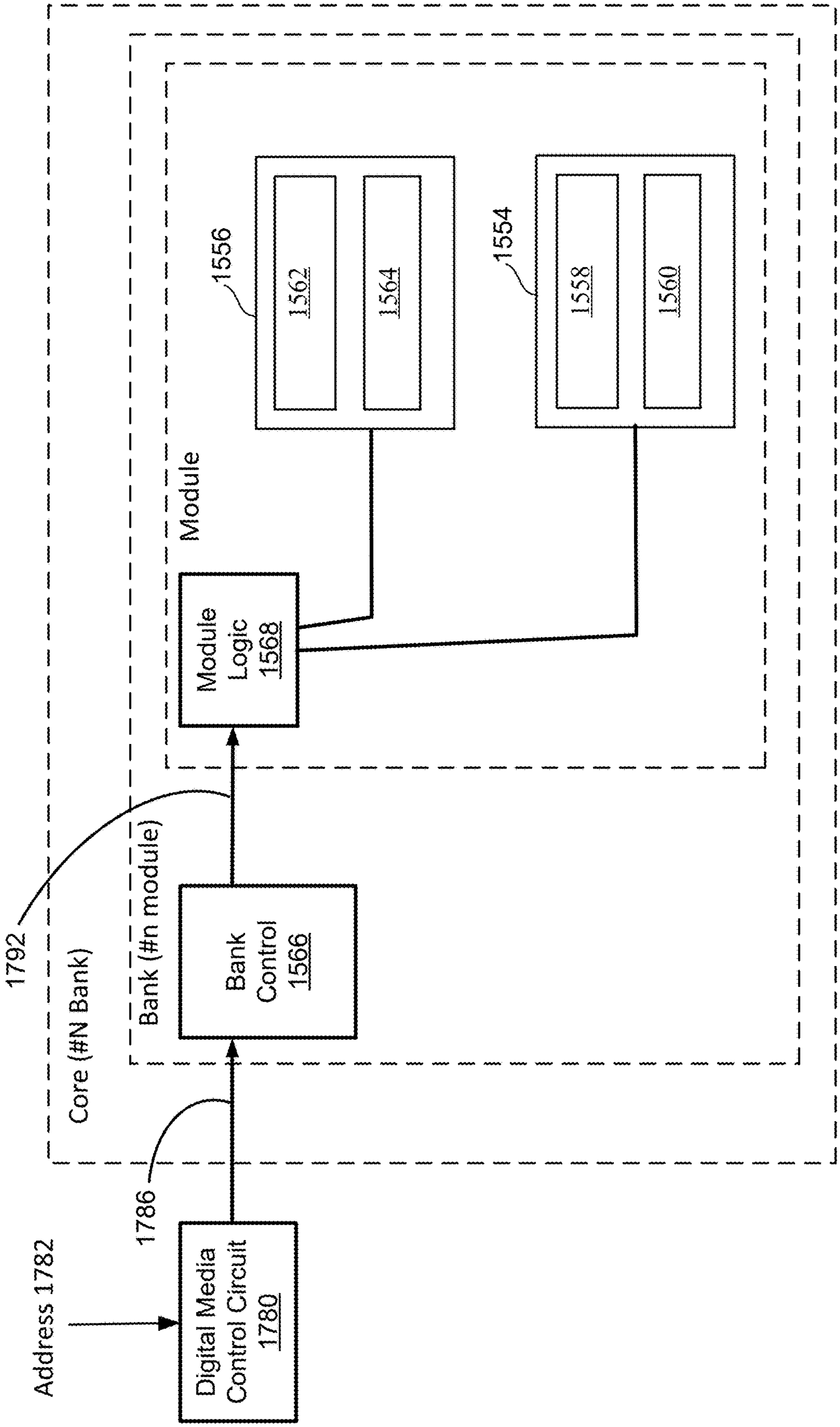
FIG. 17 illustrates a portion of a data storage system according to an example of the present technology.

FIG. 17 shows an example implementation of aspects of the present technology in a data storage system that includes a core formed of N banks, with each bank having n modules. FIG. 17 shows an example of control circuits that may be used to control switches that connect common sense amplifiers and/or drivers to word lines and bit lines.

Digital media control circuit 1780 receives an address 1782 (e.g., a logical address in a read command directed to one or more nonvolatile memory cell). Digital media control circuit 1780 may use address 1782 to generate location information 1786 (e.g., a physical address) in an appropriate format. For example, location information 1786 may include a bank, module, story and coordinates (e.g., bit line and word line) where a selected nonvolatile memory cell to be read is located (e.g., where a memory structure had stories or layers with different characteristics as illustrated in FIG. 11).

Digital media control circuit 1780 sends location information 1786 to Bank Control circuit 1566. Bank Control circuit may use location information 1786 to determine in which story (e.g., first story, Story0, or second story, Story1) a nonvolatile memory cell is located. Bank control circuit 1566 sends signal 1792 to module control circuit 1568. Module control circuit 1568 generates signals to enable/disable switches of bit line switches 1554 (e.g., first set of switches 1558 and second set of switches 1560) and word line switches 1556 (e.g., third set of switches 1562 and fourth set of switches 1564). For example, for read operations directed to nonvolatile memory cells in a first story, module control circuit 1568 may generate signals to configure switches as illustrated in FIG. 15B while for read operations directed to nonvolatile memory cells in a second story, module control circuit 1568 may generate signals to configure switches ad illustrated in FIG. 15C. While FIG. 17 shows a specific arrangement of components, the present technology is not limited to any particular arrangement and may be implemented using a wide range of components.

Figure 18A:
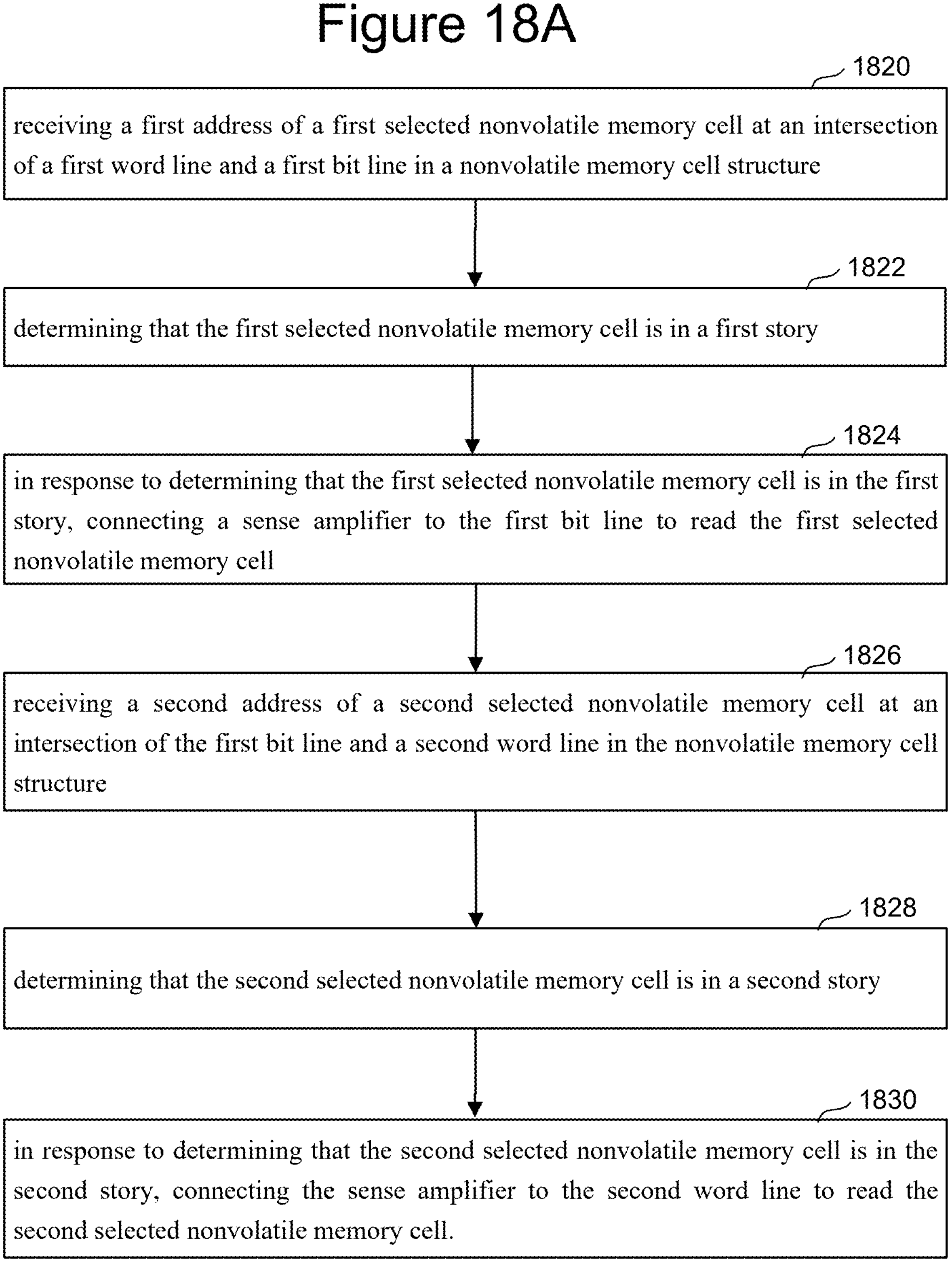
FIG. 18A illustrates an examples of a method that includes connecting a sense amplifier to a bit line and to a word line according to the story in which a nonvolatile memory cell is located.

FIG. 18A illustrates an example of a method that includes receiving a first address of a first selected nonvolatile memory cell at an intersection of a first word line and a first bit line in a nonvolatile memory cell structure 1820 (e.g., lower cell of FIG. 11), determining that the first selected nonvolatile memory cell is in a first story 1822 (e.g., Story0), in response to determining that the first selected nonvolatile memory cell is in the first story, connecting a sense amplifier to the first bit line to read the first selected nonvolatile memory cell 1824 (e.g., as illustrated in FIG. 15B). The method further includes receiving a second address of a second selected nonvolatile memory cell at an intersection of the first bit line and a second word line in the nonvolatile memory cell structure 1826 (e.g., upper cell of FIG. 11), determining that the second selected nonvolatile memory cell is in a second story 1828 (e.g., Story1) and, in response to determining that the second selected nonvolatile memory cell is in the second story, connecting the sense amplifier to the second word line to read the second selected nonvolatile memory cell 1830 (e.g., as illustrated in FIG. 15C).

Figure 18B:
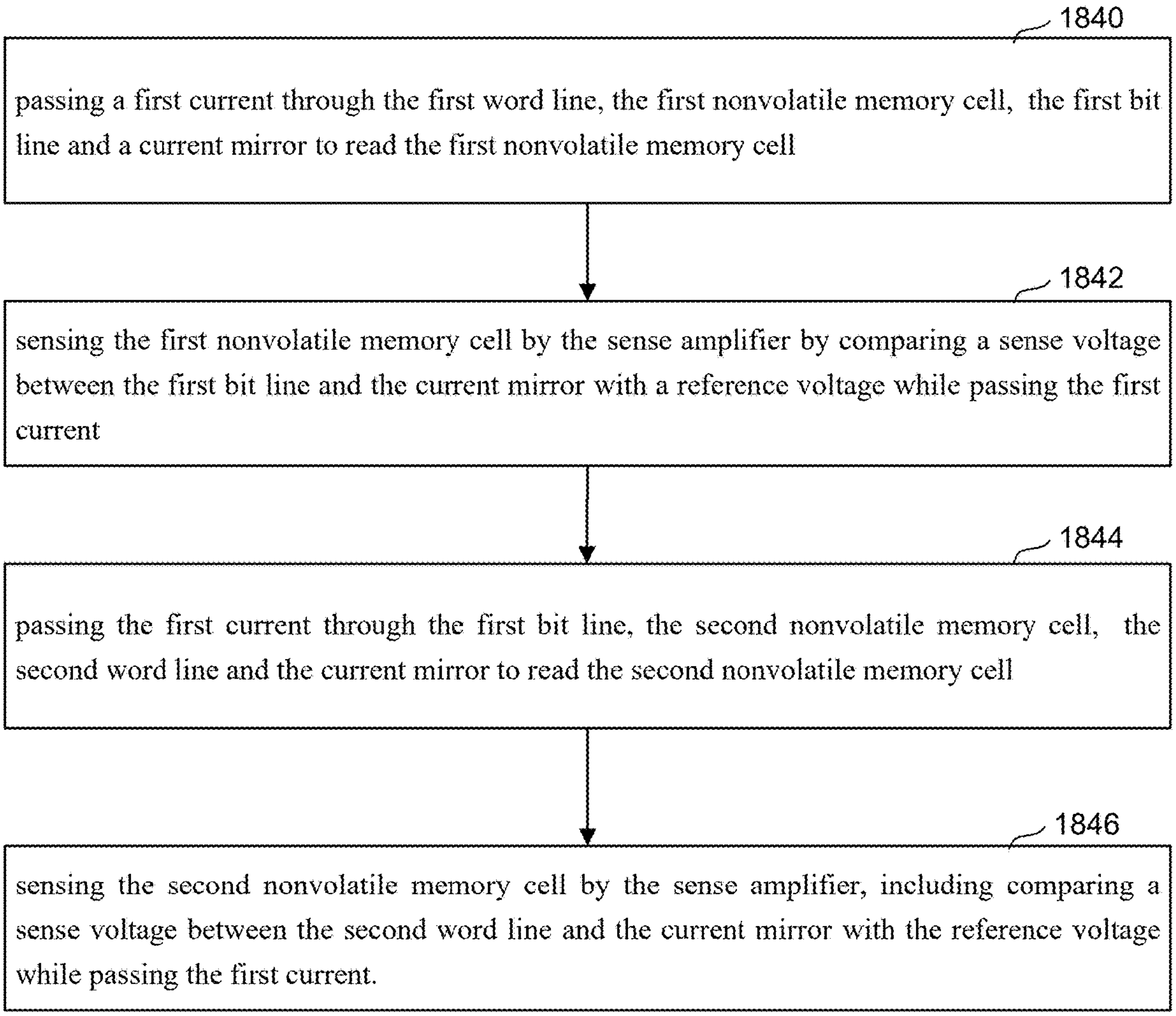
FIG. 18B illustrates an example that includes sensing nonvolatile memory cells in different stories using the same sense amplifier.

FIG. 18B shows method steps that may be performed alone or in combination with steps shown in FIG. 18A. The steps include passing a first current through the first word line, the first nonvolatile memory cell, the first bit line and a current mirror to read the first nonvolatile memory cell 1840 (e.g., Iread in FIG. 15B) sensing the first nonvolatile memory cell by the sense amplifier by comparing a sense voltage between the first bit line and the current mirror with a reference voltage while passing the first current 1842, passing the first current through the first bit line, the second nonvolatile memory cell, the second word line and the current mirror to read the second nonvolatile memory cell 1844 (e.g., Iread in FIG. 15C) and sensing the second nonvolatile memory cell by the sense amplifier, including comparing a sense voltage between the second word line and the current mirror with the reference voltage while passing the first current 1846

According to a first set of aspects, an apparatus includes one or more control circuits configured to connect to a multi-story nonvolatile memory structure. The multi-story nonvolatile memory structure that includes nonvolatile memory cells each having a programmable resistive element. The one or more control circuits are configured to receive addresses of selected nonvolatile memory cells and for each selected nonvolatile memory cell determine a story in which the selected nonvolatile memory cell is located from a plurality of stories including a first story between a first word line layer and a bit line layer and a second story between the bit line layer and a second word line layer. The one or more control circuits are further configured to connect a sense amplifier to a first selected nonvolatile memory cell in the first story through a bit line of the bit line layer and connect the sense amplifier to a second selected nonvolatile memory cell in the second story through a second word line of the second word line layer.

In one or more example of the above apparatus, the first selected nonvolatile memory cell includes a selector in contact with a first word line of the first word line layer and an MRAM cell formed between the selector and the bit line.

In one or more example of the above apparatus, the second selected nonvolatile memory cell includes a selector in contact with the bit line and an MRAM cell formed between the selector and the second word line.

In one or more example of the above apparatus, the one or more control circuits are further configured to connect a first voltage to the first selected nonvolatile memory cell through a first word line of the first word line layer and connect a second voltage that is less than the first voltage to the bit line for reading the first selected nonvolatile memory cell.

In one or more example of the above apparatus, the one or more control circuits are further configured to connect the first voltage to the second selected nonvolatile memory cell through the bit line and connect the second voltage to the second selected nonvolatile memory cell through the second word line.

In one or more example of the above apparatus, the first voltage is a positive voltage and the second voltage is a negative voltage.

In one or more example of the above apparatus, the first voltage is between 2.5 volts and 3.0 volts and the second voltage is between −2.5 volts and −3.0 volts.

In one or more example of the above apparatus, the one or more control circuits include a first plurality of switches connected between the first voltage and the bit line, a second plurality of switches connected between the bit line and the sense amplifier, a third plurality of switches connected between the first voltage and the first word line and a fourth plurality of switches connected between the first word line and the sense amplifier.

In one or more example of the above apparatus, the first plurality of switches and the second plurality of switches are formed by PMOS transistors and the third plurality of switches and the fourth plurality of switches are formed by NMOS transistors.

According to another set of aspects, a method includes receiving a first address of a first selected nonvolatile memory cell at an intersection of a first word line and a first bit line in a nonvolatile memory cell structure; determining that the first selected nonvolatile memory cell is in a first story; in response to determining that the first selected nonvolatile memory cell is in the first story, connecting a sense amplifier to the first bit line to read the first selected nonvolatile memory cell; receiving a second address of a second selected nonvolatile memory cell at an intersection of the first bit line and a second word line in the nonvolatile memory cell structure; determining that the second selected nonvolatile memory cell is in a second story; and in response to determining that the second selected nonvolatile memory cell is in the second story, connecting the sense amplifier to the second word line to read the second selected nonvolatile memory cell.

In one or more example of the above method, the method further includes connecting a first voltage to the first word line and a second voltage that is less than the first voltage to the first bit line to read the first selected nonvolatile memory cell.

In one or more example of the above method, the method further includes connecting the first voltage to the first bit line and the second voltage to the second word line to read the second selected nonvolatile memory cell.

In one or more example of the above method, the first voltage is a positive voltage and the second voltage is a negative voltage.

In one or more example of the above method, the first voltage is between 2.5 volts and 3.0 volts and the second voltage is between −2.5 volts and −3.0 volts.

In one or more example of the above method, the method further includes passing a first current through the first word line, the first selected nonvolatile memory cell, the first bit line and a current mirror to read the first selected nonvolatile memory cell; and sensing the first selected nonvolatile memory cell by the sense amplifier by comparing a sense voltage between the first bit line and the current mirror with a reference voltage while passing the first current.

In one or more example of the above method, the method further includes passing the first current through the first bit line, the second selected nonvolatile memory cell, the second word line and the current mirror to read the second selected nonvolatile memory cell; and sensing the second selected nonvolatile memory cell by the sense amplifier, including comparing a sense voltage between the second word line and the current mirror with the reference voltage while passing the first current.

In one or more example of the above method, connecting the sense amplifier to the first bit line to read the first selected nonvolatile memory cell includes turning on a first plurality of NMOS transistors connected between the first bit line and the sense amplifier while a first plurality of PMOS transistors connected between the first bit line and a supply voltage are turned off and a second plurality of PMOS transistors connecting the first word line with the supply voltage are turned on.

In one or more example of the above method, connecting the sense amplifier to the second word line to read the second selected nonvolatile memory cell includes turning on a second plurality of NMOS transistors connected between the second word line and the sense amplifier while the first plurality of NMOS transistors are turned off.

In another set of aspects, a system includes a nonvolatile memory cell structure that includes nonvolatile memory cells in a cross-point arrangement, each memory cell having a programmable resistive element; and means for reading nonvolatile memory cells that are located in a plurality of stories including a first story between a first word line layer and a bit line layer and a second story between the bit line layer and a second word line layer including connecting a sense amplifier to a first selected nonvolatile memory cell in the first story through a bit line of the bit line layer and connecting the sense amplifier to a second selected nonvolatile memory cell in the second story through a second word line of the second word line layer.

In one or more example of the above system, each nonvolatile memory cell in the first story includes a selector located between an MRAM cell and the first word line layer, the MRAM cell located between the selector and the bit line layer and each nonvolatile memory cell in the second story includes a selector located between an MRAM cell and the bit line layer, the MRAM cell located between the selector and the second word line layer.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:

one or more control circuits configured to connect to a multi-story nonvolatile memory structure that includes nonvolatile memory cells each having a programmable resistive element, the one or more control circuits configured to:

receive addresses of selected nonvolatile memory cells and for each selected nonvolatile memory cell determine a story in which the selected nonvolatile memory cell is located from a plurality of stories including a first story between a first word line layer and a bit line layer and a second story between the bit line layer and a second word line layer, connect a sense amplifier to a first selected nonvolatile memory cell in the first story through a bit line of the bit line layer and a first plurality of switches while connecting a first voltage to the first selected nonvolatile memory cell through a first word line of the first word line layer and a second plurality of switches and connect the sense amplifier to a second selected nonvolatile memory cell in the second story through a second word line of the second word line layer and a third plurality of switches while connecting the first voltage to the second selected nonvolatile memory cell through the bit line and a fourth plurality of switches.

2. The apparatus of claim 1, wherein the first selected nonvolatile memory cell includes a selector in contact with a first word line of the first word line layer and an MRAM cell formed between the selector and the bit line.

3. The apparatus of claim 2, wherein the second selected nonvolatile memory cell includes a selector in contact with the bit line and an MRAM cell formed between the selector and the second word line.

4. The apparatus of claim 1, wherein the one or more control circuits are further configured to connect a second voltage that is less than the first voltage to the bit line for reading the first selected nonvolatile memory cell.

5. The apparatus of claim 4, wherein the one or more control circuits are further configured to connect the second voltage to the second selected nonvolatile memory cell through the second word line.

6. The apparatus of claim 5, wherein the first voltage is a positive voltage and the second voltage is a negative voltage.

7. The apparatus of claim 6, wherein the first voltage is between 2.5 volts and 3.0 volts and the second voltage is between −2.5 volts and −3.0 volts.

8. The apparatus of claim 5, wherein the first plurality of switches and the third plurality of switches are formed by PMOS transistors and the second plurality of switches and the fourth plurality of switches are formed by NMOS transistors.

9. A method, comprising:

receiving a first address of a first selected nonvolatile memory cell at an intersection of a first word line and a first bit line in a nonvolatile memory cell structure;

determining that the first selected nonvolatile memory cell is in a first story;

in response to determining that the first selected nonvolatile memory cell is in the first story, connecting a sense amplifier to the first bit line to read the first selected nonvolatile memory cell;

reading the first selected nonvolatile memory cell by passing a first current through the first word line, the first selected nonvolatile memory cell, the first bit line and a current mirror while the sense amplifier senses the first selected nonvolatile memory cell by comparing a sense voltage between the first bit line and the current mirror with a reference voltage;

receiving a second address of a second selected nonvolatile memory cell at an intersection of the first bit line and a second word line in the nonvolatile memory cell structure;

determining that the second selected nonvolatile memory cell is in a second story;

in response to determining that the second selected nonvolatile memory cell is in the second story, connecting the sense amplifier to the second word line to read the second selected nonvolatile memory cell.

10. The method of claim 9, further comprising:

connecting a first voltage to the first word line and a second voltage that is less than the first voltage to the first bit line to read the first selected nonvolatile memory cell.

11. The method of claim 10, further comprising:

connecting the first voltage to the first bit line and the second voltage to the second word line to read the second selected nonvolatile memory cell.

12. The method of claim 11, wherein the first voltage is a positive voltage and the second voltage is a negative voltage.

13. The method of claim 12, wherein the first voltage is between 2.5 volts and 3.0 volts and the second voltage is between −2.5 volts and −3.0 volts.

14. The method of claim 9, further comprising:

passing the first current through the first bit line, the second selected nonvolatile memory cell, the second word line and the current mirror to read the second selected nonvolatile memory cell; and sensing the second selected nonvolatile memory cell by the sense amplifier, including comparing a sense voltage between the second word line and the current mirror with the reference voltage while passing the first current.

15. The method of claim 9, wherein connecting the sense amplifier to the first bit line to read the first selected nonvolatile memory cell includes turning on a first plurality of NMOS transistors connected between the first bit line and the sense amplifier while a first plurality of PMOS transistors connected between the first bit line and a supply voltage are turned off and a second plurality of PMOS transistors connecting the first word line with the supply voltage are turned on.

16. The method of claim 15 wherein, connecting the sense amplifier to the second word line to read the second selected nonvolatile memory cell includes turning on a second plurality of NMOS transistors connected between the second word line and the sense amplifier while the first plurality of NMOS transistors are turned off.

17. A system, comprising:

a nonvolatile memory cell structure that includes nonvolatile memory cells in a cross-point arrangement, each memory cell having a programmable resistive element; and means for reading nonvolatile memory cells that are located in a plurality of stories including a first story between a first word line layer and a bit line layer and a second story between the bit line layer and a second word line layer including connecting a sense amplifier to a first selected nonvolatile memory cell in the first story through a bit line of the bit line layer to read the first selected nonvolatile memory cell by passing a first current through a first word line of the first word line layer, the first selected nonvolatile memory cell, the bit line and a current mirror while the sense amplifier senses the first selected nonvolatile memory cell by comparing a sense voltage between the first bit line and the current mirror with a reference voltage and connecting the sense amplifier to a second selected nonvolatile memory cell in the second story through a second word line of the second word line layer.

18. The system of claim 17, wherein each nonvolatile memory cell in the first story includes a selector located between an MRAM cell and the first word line layer, the MRAM cell located between the selector and the bit line layer and each nonvolatile memory cell in the second story includes a selector located between an MRAM cell and the bit line layer, the MRAM cell located between the selector and the second word line layer.

* * * * *